US012593462B2

(12) United States Patent
Sakaguchi et al.

(10) Patent No.: US 12,593,462 B2
(45) Date of Patent: Mar. 31, 2026

(54) IGBT AND DIODE WITH LIFETIME CONTROL REGIONS

(71) Applicant: Mitsubishi Electric Corporation, Tokyo (JP)

(72) Inventors: Kosuke Sakaguchi, Tokyo (JP); Takahiro Nakatani, Tokyo (JP); Koichi Nishi, Tokyo (JP); Shinya Soneda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 944 days.

(21) Appl. No.: 17/806,213

(22) Filed: Jun. 9, 2022

(65) Prior Publication Data

US 2023/0126799 A1    Apr. 27, 2023

(30) Foreign Application Priority Data

Oct. 21, 2021    (JP) ................................. 2021-172675

(51) Int. Cl.
H10D 12/00 (2025.01)
H10D 62/83 (2025.01)
(Continued)

(52) U.S. Cl.
CPC ....... H10D 12/411 (2025.01); H10D 62/8303 (2025.01); H10D 62/8325 (2025.01); H10D 62/8503 (2025.01)

(58) Field of Classification Search
CPC .... H10D 12/481; H10D 12/038; H10D 62/53; H10D 12/411–491; H10D 12/00
See application file for complete search history.

(56) References Cited

U.S. PATENT DOCUMENTS

2008/0048295 A1    2/2008  Takahashi
2012/0267681 A1    10/2012  Nemoto et al.
(Continued)

FOREIGN PATENT DOCUMENTS

DE    112019000094 T5    9/2020
DE    112019001123 T5    11/2020
(Continued)

OTHER PUBLICATIONS

"Notice of Reasons for Refusal" Office Action issued in JP 2021-172675; mailed by the Japanese Patent Office on Dec. 10, 2024.
(Continued)

*Primary Examiner* — Wasiul Haider
(74) *Attorney, Agent, or Firm* — Studebaker Brackett PLLC

(57) ABSTRACT

According to the disclosure, a semiconductor device includes a semiconductor substrate including an IGBT region and a diode region, a first electrode provided on an upper surface of the semiconductor substrate and a second electrode provided on a back surface of the semiconductor substrate, wherein the diode region includes an n-type drift layer, a p-type anode layer provided on an upper surface side of the drift layer, and an n-type cathode layer provided on a back surface side of the drift layer, a lifetime control region having crystal defect density higher than crystal defect density of other portions of the drift layer and including protons is provided on a back surface side relative to a center in a thickness direction of the semiconductor substrate among the drift layer, and a maximum value of donor concentration of the lifetime control region is equal to or less than $1.0 \times 10^{15}/cm^3$.

16 Claims, 18 Drawing Sheets

(51) Int. Cl.
  H10D 62/832     (2025.01)
  H10D 62/85      (2025.01)

(56)            References Cited

U.S. PATENT DOCUMENTS

| | | | | |
|---|---|---|---|---|
| 2016/0254374 | A1* | 9/2016 | Kameyama | H10D 8/01 |
| | | | | 257/140 |
| 2016/0351561 | A1* | 12/2016 | Senoo | H10D 62/129 |
| 2017/0162560 | A1 | 6/2017 | Takahashi et al. | |
| 2018/0248003 | A1 | 8/2018 | Nakamura et al. | |
| 2019/0067462 | A1 | 2/2019 | Tamura et al. | |
| 2019/0165102 | A1* | 5/2019 | Fujimoto | H10D 62/142 |
| 2020/0194562 | A1 | 6/2020 | Yoshimura et al. | |
| 2021/0082702 | A1 | 3/2021 | Agata et al. | |
| 2022/0328667 | A1* | 10/2022 | Kubouchi | H10D 12/481 |

FOREIGN PATENT DOCUMENTS

| | | | |
|---|---|---|---|
| JP | 5103830 | B2 | 12/2012 |
| JP | 2018-078314 | A | 5/2018 |
| WO | 2016/030966 | A1 | 3/2016 |
| WO | 2017/115434 | A1 | 7/2017 |
| WO | 2018/092788 | A1 | 5/2018 |
| WO | 2020/080295 | A1 | 4/2020 |

OTHER PUBLICATIONS

An Office Action mailed by the Japanese Patent Office on Aug. 6, 2024, which corresponds to Japanese Patent Application No. 2021-172675 and is related to U.S. Appl. No. 17/806,213; with English language translation.
Office Action issued by the German Patent and Trade Mark Office for Application No. 10 2022 119 699.2, dated Oct. 19, 2025.

* cited by examiner

IGBT AND DIODE WITH LIFETIME CONTROL REGIONS

BACKGROUND OF THE INVENTION

Field

The present disclosure relates to a semiconductor device and a method for manufacturing the semiconductor device.

Background

JP 5103830 B discloses an insulated gate semiconductor device in which a first region and a second region adjacent to the first region are provided on a substrate. The first region operates as an insulated gate bipolar transistor (IGBT), and the second region operates as a diode.

A reverse-conducting (RC)-IGBT as in JP 5103830 B can exhibit improved heat dissipation compared to a case where an IGBT and a diode are separately formed. It is therefore possible to achieve design with a reduced effective area and high current density. On the other hand, the RC-IGBT has high current density and high carrier density in the diode region. This makes it difficult to remove carriers during recovery operation, which may generate tail currents. Thus, there is a possibility that recovery losses Err cannot be sufficiently reduced.

Summary

The present disclosure has been made to solve the above-described problem and is directed to providing a semiconductor device capable of reducing tail currents during recovery operation and a method for manufacturing the semiconductor device.

According to an aspect of the first disclosure, a semiconductor device includes a semiconductor substrate including an IGBT region and a diode region, a first electrode provided on an upper surface of the semiconductor substrate and a second electrode provided on a back surface that is an opposite side of the upper surface of the semiconductor substrate, wherein the diode region includes an n-type drift layer, a p-type anode layer provided on an upper surface side of the drift layer, and an n-type cathode layer provided on a back surface side of the drift layer, a first lifetime control region having crystal defect density higher than crystal defect density of other portions of the drift layer and including protons is provided on a back surface side relative to a center in a thickness direction of the semiconductor substrate among the drift layer, and a maximum value of donor concentration of the first lifetime control region is equal to or less than $1.0 \times 10^{15}/cm^3$.

According to an aspect of the second disclosure, a semiconductor device includes a semiconductor substrate including an IGBT region and a diode region, a first electrode provided on an upper surface of the semiconductor substrate and a second electrode provided on a back surface that is an opposite side of the upper surface of the semiconductor substrate, wherein the diode region includes an n-type drift layer, a p-type anode layer provided on an upper surface side of the drift layer, and an n-type cathode layer provided on a back surface side of the drift layer, a first lifetime control region having crystal defect density higher than crystal defect density of other portions of the drift layer and including protons is provided on a back surface side relative to a center in a thickness direction of the semiconductor substrate among the drift layer, and a maximum value of donor concentration of the first lifetime control region is equal to or less than 10 times of donor concentration of the other portions of the drift layer.

According to an aspect of the third disclosure, a method for manufacturing a semiconductor device includes forming a p-type base layer provided on an upper surface side of an IGBT region among an n-type semiconductor substrate, an n-type source layer provided on an upper surface side of the base layer, and a p-type anode layer provided on an upper surface side of a diode region among the semiconductor substrate, injecting protons from a back surface side that is an opposite side of an upper surface of the diode region at first acceleration energy, injecting protons from the back surface side of the diode region at second acceleration energy smaller than the first acceleration energy, forming a lifetime control region by heating a region to which protons are injected at the first acceleration energy at a temperature lower than 350° C., forming an n-type buffer layer on a back surface side of the lifetime control region by heating a region to which protons are injected at the second acceleration energy at a temperature equal to or higher than 350° C. and forming a p-type collector layer provided on a back surface side of the IGBT region and an n-type cathode layer provided on a back surface side of the buffer layer among the diode region.

According to an aspect of the fourth disclosure, a method for manufacturing a semiconductor device includes forming a p-type base layer provided on an upper surface side of an IGBT region among an n-type semiconductor substrate, an n-type source layer provided on an upper surface side of the base layer, and a p-type anode layer provided on an upper surface side of a diode region among the semiconductor substrate, injecting protons from a back surface side that is an opposite side of an upper surface of the diode region at first acceleration energy, forming a lifetime control region by heating a region to which protons are injected at the first acceleration energy at a temperature lower than 350° C., injecting a donor to a region shallower than the lifetime control region from the back surface side of the diode region, forming an n-type buffer layer on a back surface side of the lifetime control region by heating the region to which the donor is injected and forming a p-type collector layer provided on a back surface side of the IGBT region and an n-type cathode layer provided on a back surface side of the buffer layer among the diode region.

Other and further objects, features and advantages of the disclosure will appear more fully from the following description.

BRIEF DESCRIPTION OF DRAWINGS

FIG. 3 is a plan view of the IGBT region according to the first embodiment.

DESCRIPTION OF EMBODIMENTS

Figure 1:
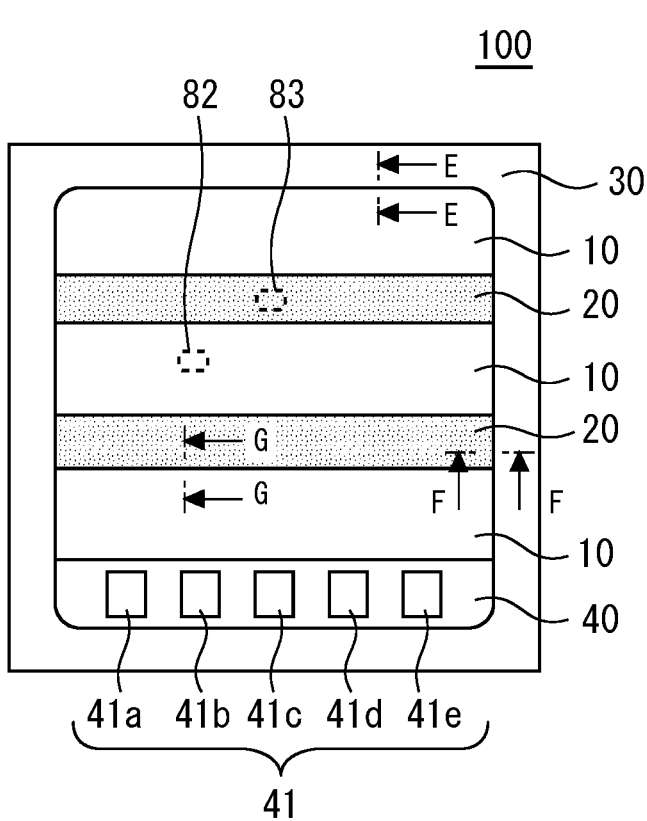
FIG. 1 is a plan view of a semiconductor device according to the first embodiment.

A semiconductor device and a method for manufacturing the semiconductor device according to each embodiment will be described with reference to the drawings. The same reference numerals will be assigned to the same or corresponding components, and repetitive description will be omitted in some cases. In the following description, n and p indicate conductive types of a semiconductor, $n^-$ indicates that impurity concentration is lower than impurity concentration of n, and $n^+$ indicates that the impurity concentration is higher than the impurity concentration of n. In a similar manner, $p^-$ indicates that impurity concentration is lower than impurity concentration of p, and $p^+$ indicates that the impurity concentration is higher than the impurity concentration of p.

First Embodiment

Figure 2:
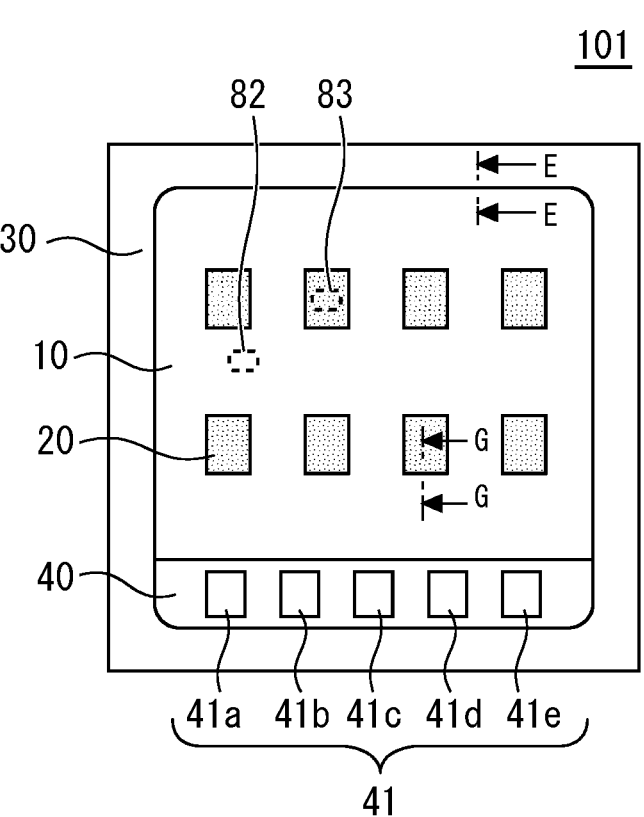
FIG. 2 is a plan view of a semiconductor device according to a modification of the first embodiment.

FIG. 1 is a plan view of a semiconductor device 100 according to the first embodiment. FIG. 2 is a plan view of a semiconductor device 101 according to a modification of the first embodiment. The semiconductor devices 100 and 101 are RC-IGBTs. Each of the semiconductor devices 100 and 101 includes a semiconductor substrate including an IGBT region 10 and a diode region 20. In the semiconductor device 100, the IGBT region 10 and the diode region 20 are arranged in a stripe pattern. The semiconductor device 100 may be referred to as a "stripe type". In the semiconductor device 101, a plurality of diode regions 20 are provided in a longitudinal direction and in a lateral direction. The IGBT region 10 is provided around the diode regions 20. The semiconductor device 101 may be referred to as an "island type".

First, a structure of the semiconductor device 100 will be described. The semiconductor device 100 includes the IGBT region 10 and the diode region 20 within one semiconductor device. The IGBT region 10 and the diode region 20 extend from one end side to the other end side of the semiconductor device 100. The IGBT region 10 and the diode region 20 are alternately provided in a stripe pattern in a direction orthogonal to an extending direction of the IGBT region 10 and the diode region 20. FIG. 1 illustrate three IGBT regions 10 and two diode regions. Further, all the diode regions 20 are put between the IGBT regions 10. There may be three or more IGBT regions 10 or three or less IGBT regions 10. There may be two or more diode regions 20 or two or less diode regions 20. Further, in FIG. 1, positions of the IGBT regions 10 may be exchanged with positions of the diode regions 20. In other words, all the IGBT regions 10 may be put between the diode regions 20. Further, the IGBT regions 10 may be adjacent to the diode regions 20 one by one.

A pad region 40 is provided adjacent to the IGBT region 10 in a lower portion of the drawing. The pad region 40 is a region in which control pads 41 for controlling the semiconductor device 100 are provided. The IGBT region 10 and the diode region 20 are collectively referred to as a cell region. A termination region 30 for holding a withstand voltage of the semiconductor device 100 is provided around a combined region of the cell region and the pad region 40.

In the termination region 30, a well-known withstand voltage holding structure that is selected as appropriate can be provided. The withstand voltage holding structure is, for example, field limiting ring (FLR) or variation of lateral doping (VLD). The FLR is constituted with a p-type termination well layer provided on an upper surface side of the semiconductor substrate so as to surround the cell region. The VLD is constituted with a p-type well layer that surrounds the cell region and has concentration gradient. The number of ring-shaped p-type termination well layers to be used in the FLR and concentration distribution to be used in the VLD may be selected as appropriate in accordance with withstand voltage design of the semiconductor device 100. Further, the p-type termination well layer may be provided over an entire region of the pad region 40. An IGBT cell or a diode cell may be provided in the pad region 40.

The control pads 41 include, for example, a current sense pad 41a, a Kelvin emitter pad 41b, a gate pad 41c, and temperature sense diode pads 41d and 41e. The current sense pad 41a is a control pad for detecting a current flowing through the cell region. The current sense pad 41a is electrically connected to an IGBT cell or a diode cell that is part of the cell region so that a current of one severalth to one ten-thousandth of a current flowing through the whole cell region flows.

The Kelvin emitter pad 41b and the gate pad 41c are control pads to which a gate drive voltage for controlling ON/OFF of the semiconductor device 100 is to be applied. The Kelvin emitter pad 41b is electrically connected to a p-type base layer and an $n^+$-type source layer of the IGBT cell. The gate pad 41c is electrically connected to a gate trench electrode of the IGBT cell. The Kelvin emitter pad 41b and the p-type base layer may be electrically connected via a $p^+$-type contact layer.

The temperature sense diode pads 41d and 41e are control pads electrically connected to an anode and a cathode of a temperature sense diode provided in the semiconductor device 100. A voltage between the anode and the cathode of the temperature sense diode (not illustrated) provided within the cell region is measured by the temperature sense diode pads 41d and 41e, thereby a temperature of the semiconductor device 100 can be measured.

A structure of the semiconductor device 101 will be described next. In the semiconductor device 101, the diode regions 20 are surrounded by the IGBT region 10. In other words, a plurality of diode regions 20 are provided in an insular pattern within the IGBT region 10. In FIG. 2, the diode regions 20 are provided in a matrix of four columns in a horizontal direction in the drawing and two rows in a vertical direction in the drawing. The arrangement is not limited to this, and it is only necessary that one or a plurality of diode regions 20 are scattered within the IGBT region 10 and each diode region 20 is surrounded by the IGBT region 10. Structures of the pad region 40 and the termination region 30 are similar to those in the semiconductor device 100.

Figure 3:
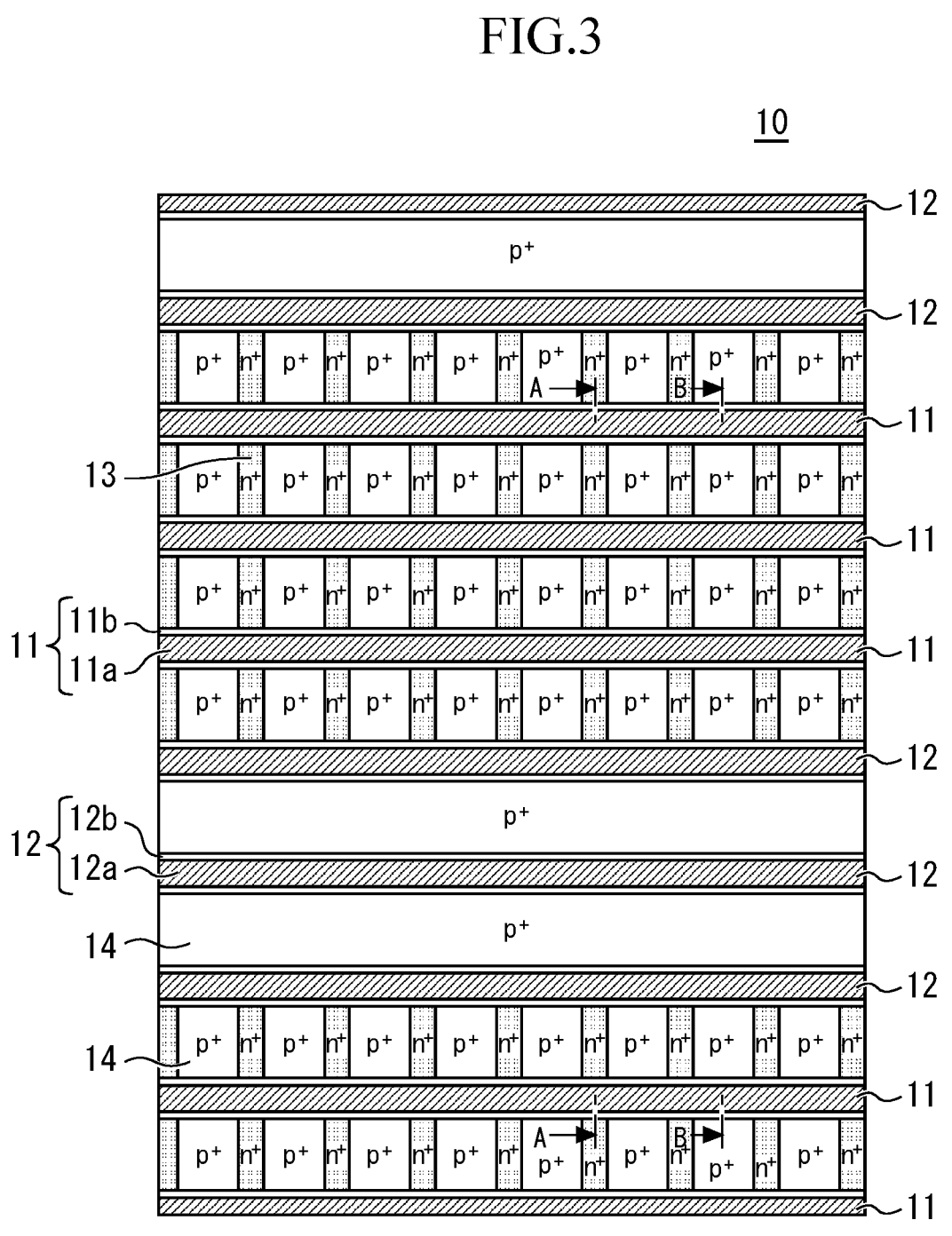
Figure 4:
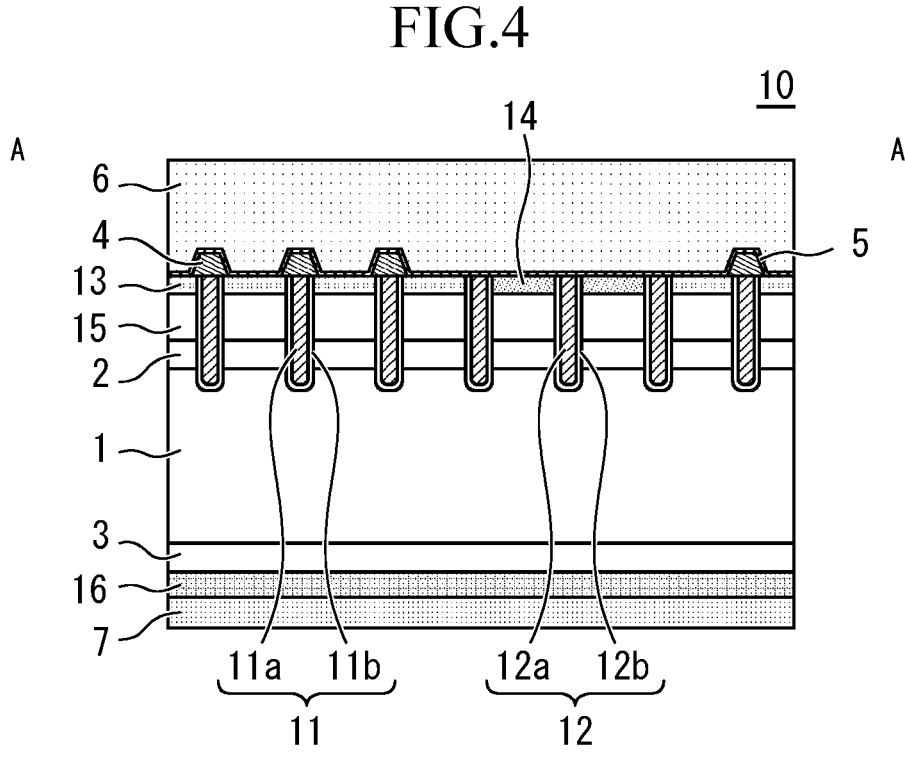
FIG. 4 is a cross-sectional diagram obtained by cutting FIG. 3 along a line A-A.
Figure 5:
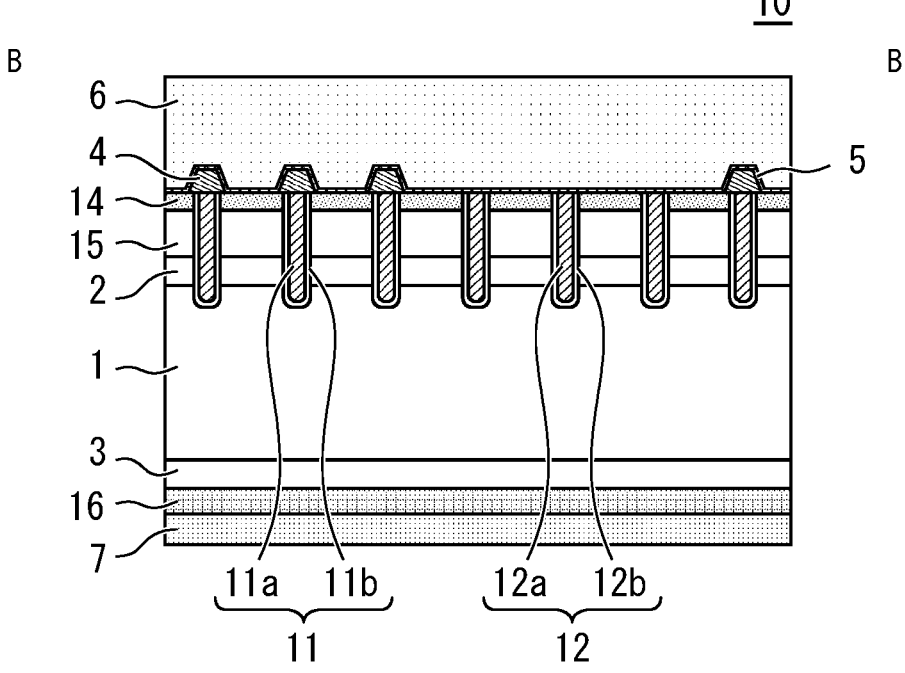
FIG. 5 is a cross-sectional diagram obtained by cutting FIG. 3 along a line B-B.

FIG. 3 is a plan view of the IGBT region 10 according to the first embodiment. FIG. 3 is an enlarged view of a region surrounded with a dashed line 82 illustrated in FIG. 1 or FIG. 2. FIG. 4 is a cross-sectional diagram obtained by cutting FIG. 3 along a line A-A. FIG. 5 is a cross-sectional diagram obtained by cutting FIG. 3 along a line B-B. As illustrated in FIG. 3, an active trench gate 11 and a dummy trench gate 12 are provided in a stripe pattern in the IGBT region 10. In the semiconductor device 100, the active trench gate 11 and the dummy trench gate 12 extend in a longitudinal direction of the IGBT region 10. The longitudinal direction of the IGBT region 10 is longitudinal directions of the active trench gate 11 and the dummy trench gate 12. On the other hand, in the semiconductor device 101, there is no distinction between the longitudinal direction and a shorter direction of the IGBT region 10. In the semiconductor device 101, a horizontal direction in the drawing may be set as the longitudinal directions of the active trench gate 11 and the dummy trench gate 12. Alternatively, a vertical direction in the drawing may be set as the longitudinal directions of the active trench gate 11 and the dummy trench gate 12.

In the active trench gate 11, a gate trench electrode 11a is provided via a gate trench insulating film 11b within a trench formed on the semiconductor substrate. In the dummy trench gate 12, a dummy trench electrode 12a is provided via a dummy trench insulating film 12b within a trench formed on the semiconductor substrate. The gate trench electrode 11a of the active trench gate 11 is electrically connected to the gate pad 41c. The dummy trench electrode 12a of the dummy trench gate 12 is electrically connected to an emitter electrode 6 provided on an upper surface of the semiconductor substrate.

The n$^+$-type source layer 13 is brought into contact with the gate trench insulating film 11b on both sides in a width direction of the active trench gate 11. The n$^+$-type source layer 13 includes, for example, arsenic, phosphorus, or the like, as an n-type impurity. Concentration of the n-type impurity of the n$^+$-type source layer 13 is $1.0 \times 10^{17}$/cm$^3$ to $1.0 \times 10^{20}$/cm$^3$. The n$^+$-type source layer 13 and the p$^+$-type contact layer 14 are alternately provided along an extending direction of the active trench gate 11. The p$^+$-type contact layer 14 is also provided between two adjacent dummy trench gates 12. The p$^+$-type contact layer 14 includes, for example, boron or aluminum as a p-type impurity. Concentration of the p-type impurity of the p$^+$-type contact layer 14 is $1.0 \times 10^{15}$/cm$^3$ to $1.0 \times 10^{20}$/cm$^3$. Note that the source layer may be referred to as an emitter layer.

As illustrated in FIG. 3, in the IGBT region 10, three dummy trench gates 12 are arranged adjacent to three active trench gates 11. Further, three active trench gates 11 are arranged adjacent to three dummy trench gates 12. In other words, in the IGBT region 10, a set of the active trench gates 11 and a set of the dummy trench gates 12 are alternately arranged. It is only necessary that one or more active trench gates 11 are included in one set of the active trench gates 11. Further, one or more dummy trench gates 12 may be included in one set of the dummy trench gates 12 or no dummy trench gate 12 may be included. In other words, all of the trenches provided in the IGBT region 10 may be the active trench gates 11.

The semiconductor substrate includes an n$^-$-type drift layer 1. The n$^-$-type drift layer 1 includes, for example, arsenic or phosphorus as an n-type impurity. Concentration of the n-type impurity of the n$^-$-type drift layer 1 is $1.0 \times 10^{12}$/cm$^3$ to $1.0 \times 10^{15}$/cm$^3$. The semiconductor substrate has a range from the n$^+$-type source layer 13 and the p$^+$-type contact layer 14 to a p-type collector layer 16 in FIG. 4. In FIG. 4, an upper end of the n$^+$-type source layer 13 and the p$^+$-type contact layer 14 in the drawing will be referred to as the upper surface of the semiconductor substrate, and a lower end of the p-type collector layer 16 in the drawing will be referred to as a back surface of the semiconductor substrate. The back surface is a surface on an opposite side of the upper surface.

In the IGBT region 10, an n-type carrier accumulation layer 2 having higher concentration of the n-type impurity than that of the n$^-$-type drift layer 1 is provided on an upper surface side of the n$^-$-type drift layer 1. The n-type carrier accumulation layer 2 includes, for example, arsenic or phosphorus as an n-type impurity. Concentration of the n-type impurity of the n-type carrier accumulation layer 2 is $1.0 \times 10^{13}$/cm$^3$ to $1.0 \times 10^{17}$/cm$^3$. Note that the n$^-$-type drift layer 1 may be also provided in a region of the n-type carrier accumulation layer 2 instead of the n-type carrier accumulation layer 2. An energization loss when a current flows through the IGBT region 10 can be reduced by the n-type carrier accumulation layer 2. The n-type carrier accumulation layer 2 and the n$^-$-type drift layer 1 may be collectively referred to as a drift layer.

In a method for forming the n-type carrier accumulation layer 2, first, n-type impurity ions are implanted to the semiconductor substrate including the n$^-$-type drift layer 1. Then, the implanted n-type impurity is spread within the n$^-$-type drift layer 1 through annealing. In this event, impurity concentration may gently change near a boundary of the n-type carrier accumulation layer 2 and the n$^-$-type drift layer 1.

The p-type base layer 15 is provided on the upper surface side of the n-type carrier accumulation layer 2. The p-type base layer 15 includes, for example, boron or aluminum as a p-type impurity. Concentration of the p-type impurity of the p-type base layer 15 is $1.0 \times 10^{12}$/cm$^3$ to $1.0 \times 10^{19}$/cm$^3$. The p-type base layer 15 is brought into contact with the gate trench insulating film 11b of the active trench gate 11. The n$^+$-type source layer 13 is provided in contact with the gate trench insulating film 11b of the active trench gate 11, on the upper surface side of the p-type base layer 15. The p$^+$-type contact layer 14 is provided in a region other than the n$^+$-type source layer 13 among the upper surface side of the p-type base layer 15. The n$^+$-type source layer 13 and the p$^+$-type contact layer 14 constitute the upper surface of the semiconductor substrate.

Note that the p$^+$-type contact layer 14 is a region having higher concentration of the p-type impurity than that of the p-type base layer 15. In a case where it is necessary to distinguish the p$^+$-type contact layer 14 from the p-type base layer 15, they may be individually referred to as the p$^+$-type contact layer 14 and the p-type base layer 15. The p$^+$-type contact layer 14 and the p-type base layer 15 may be collectively referred to as a p-type base layer.

An n-type buffer layer 3 having higher concentration of the n-type impurity than that of the n$^-$-type drift layer 1 is provided on the back surface side of the n$^-$-type drift layer 1. The n-type buffer layer 3 is provided for preventing punch-through of a depletion layer extending from the p-type base layer 15 to the back surface side when the semiconductor device 100 or the semiconductor device 101 is in an OFF state. The n-type buffer layer 3 is formed by injecting, for example, phosphorus or protons. The n-type buffer layer 3 may be formed by injecting both phosphorus and protons. Concentration of the n-type impurity of the n-type buffer layer 3 is $1.0\times10^{14}/cm^3$ to $1.0\times10^{18}/cm^3$.

Note that the n⁻-type drift layer 1 may be also provided in a region of the n-type buffer layer 3 illustrated in FIG. 4 instead of the n-type buffer layer 3. The n-type buffer layer 3 and the n⁻-type drift layer 1 may be collectively referred to as a drift layer.

The p-type collector layer 16 is provided on the back surface side of the n-type buffer layer 3. The p-type collector layer 16 includes, for example, boron or aluminum as a p-type impurity. Concentration of the p-type impurity of the p-type collector layer 16 is $1.0\times10^{16}/cm^3$ to $1.0\times10^{20}/cm^3$. The p-type collector layer 16 constitutes the back surface of the semiconductor substrate. The p-type collector layer 16 may also be provided in the termination region 30 as well as the IGBT region 10. A portion of the p-type collector layer 16 provided in the termination region 30 is the p-type termination collector layer 16a. Further, the p-type collector layer 16 may be provided while part of the p-type collector layer 16 protrudes from the IGBT region 10 to the diode region 20.

The trench pierces through the p-type base layer 15 from the upper surface of the semiconductor substrate and reaches the n⁻-type drift layer 1. In the active trench gate 11, the gate trench electrode 11a faces the n⁻-type drift layer 1 via the gate trench insulating film 11b. In the dummy trench gate 12, the dummy trench electrode 12a faces the n⁻-type drift layer 1 via the dummy trench insulating film 12b. The gate trench insulating film 11b is brought into contact with the p-type base layer 15 and the n⁺-type source layer 13. If a gate drive voltage is applied to the gate trench electrode 11a, a channel is formed in the p-type base layer 15 that is brought into contact with the gate trench insulating film 11b.

An inter-layer insulating film 4 is provided on the gate trench electrode 11a of the active trench gate 11. A barrier metal 5 is formed in a region where the inter-layer insulating film 4 is not provided among the upper surface of the semiconductor substrate and on the inter-layer insulating film 4. The barrier metal 5 is, for example, a conductor including titanium. The barrier metal 5 may be titanium nitride or TiSi obtained by alloying titanium and silicon. The barrier metal 5 is brought into ohmic contact with and electrically connected to the n⁺-type source layer 13, the p⁺-type contact layer 14 and the dummy trench electrode 12a.

The emitter electrode 6 is provided on the barrier metal 5. The emitter electrode 6 is a first electrode provided on the upper surface of the semiconductor substrate. The emitter electrode 6 is, for example, formed with an aluminum alloy such as an aluminum-silicon alloy. The emitter electrode 6 may be an electrode formed with a multilayer metal film. In the multilayer metal film, for example, a plating film formed through non-electrolytic plating or electrolytic plating is provided on an electrode formed with an aluminum alloy. The plating film formed through non-electrolytic plating or electrolytic plating is, for example, a nickel plating film.

In a minute region such as a region between adjacent inter-layer insulating films 4, there is a case where favorable embedding cannot be obtained with the emitter electrode 6. In this case, tungsten which has embeddability more favorable than embeddability of the emitter electrode 6 may be provided in the minute region, and the emitter electrode 6 may be provided on tungsten. Further, the emitter electrode 6 may be provided on the semiconductor substrate without the barrier metal 5 being provided. Still further, the barrier metal 5 may be provided only on an n-type semiconductor layer such as the n⁺-type source layer 13. The barrier metal 5 and the emitter electrode 6 may be collectively referred to as an emitter electrode. In FIG. 4, the inter-layer insulating film 4 is not provided on the dummy trench electrode 12a. The inter-layer insulating film 4 may be formed on the dummy trench electrode 12a. In this case, it is only necessary to electrically connect the emitter electrode 6 and the dummy trench electrode 12a in another cross-section.

The collector electrode 7 is provided on the back surface side of the p-type collector layer 16. The collector electrode 7 is a second electrode provided on the back surface of the semiconductor substrate. The collector electrode 7 may be constituted with an aluminum alloy or an aluminum alloy and a plating film in a similar manner to the emitter electrode 6. Further, the collector electrode 7 may have a configuration different from the configuration of the emitter electrode 6. The collector electrode 7 is brought into ohmic contact with the p-type collector layer 16 and is electrically connected to the p-type collector layer 16.

Unlike the cross-section A-A illustrated in FIG. 4, the n⁺-type source layer 13 does not appear in the cross-section B-B illustrated in FIG. 5. In other words, the n⁺-type source layer 13 is selectively provided on the upper surface side of the p-type base layer. Note that the p-type base layer described here refers to the p-type base layer that is collective designation of the p-type base layer 15 and the p⁺-type contact layer 14.

Figure 6:
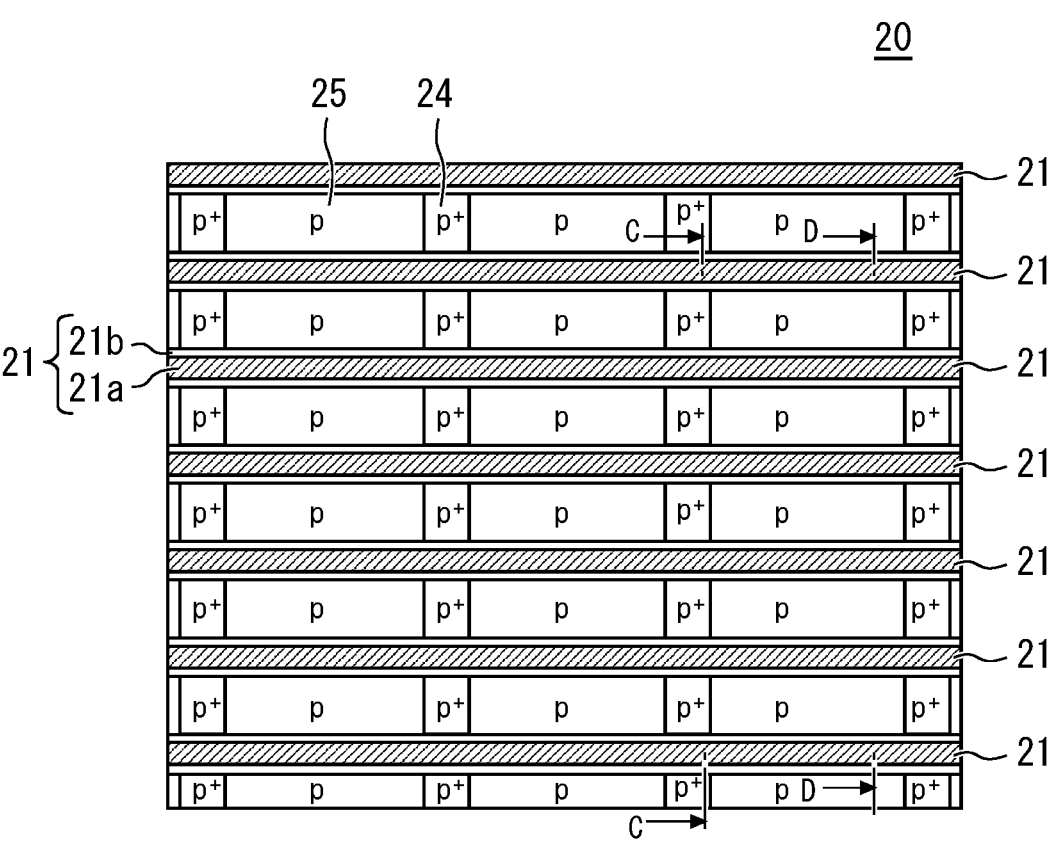
FIG. 6 is a plan view of the diode region according to the first embodiment.
Figure 7:
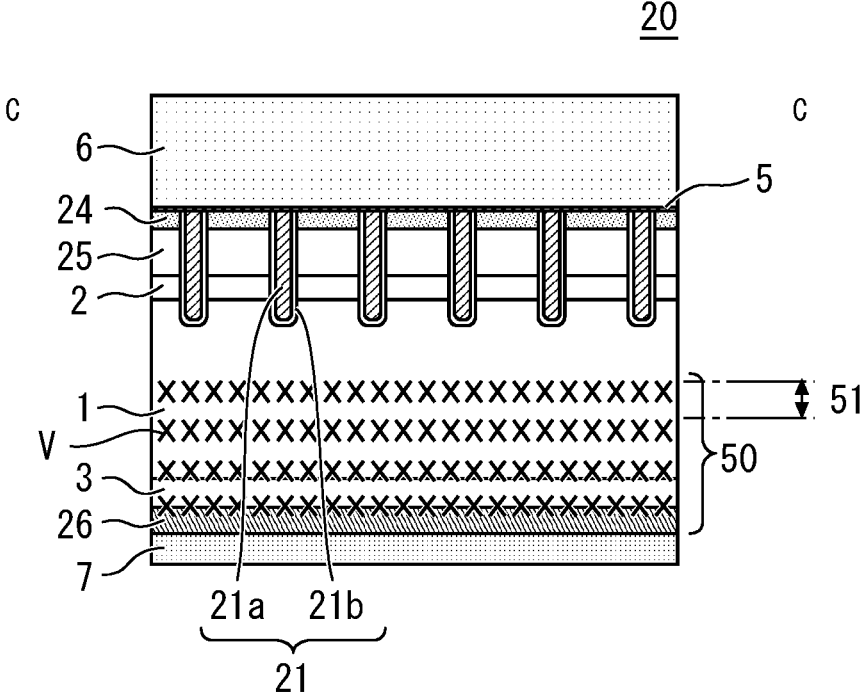
FIG. 7 is a cross-sectional diagram obtained by cutting FIG. 6 along a line C-C.
Figure 8:
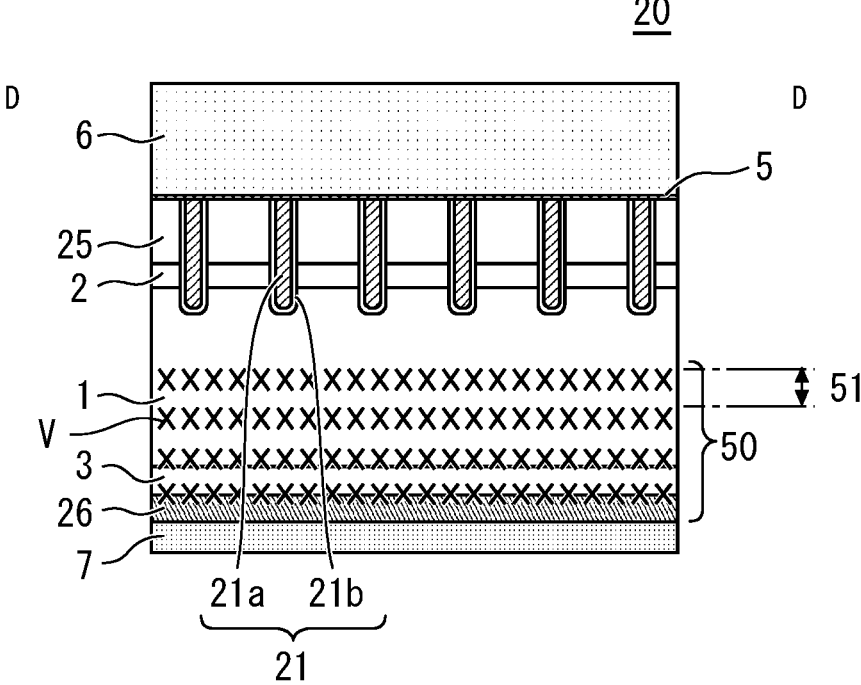
FIG. 8 is a cross-sectional diagram obtained by cutting FIG. 6 along a line D-D.

FIG. 6 is a plan view of the diode region 20 according to the first embodiment. FIG. 6 is an enlarged view of a region surrounded with a dashed line 83 illustrated in FIG. 1 or FIG. 2. FIG. 7 is a cross-sectional diagram obtained by cutting FIG. 6 along a line C-C. FIG. 8 is a cross-sectional diagram obtained by cutting FIG. 6 along a line D-D. The diode trench gate 21 extends from one end side to the opposing other end side of the diode region 20. In the diode trench gate 21, a diode trench electrode 21a is provided via a diode trench insulating film 21b within a trench formed on the semiconductor substrate.

The diode trench electrode 21a faces the n⁻-type drift layer 1 via the diode trench insulating film 21b. A p⁺-type contact layer 24 and a p-type anode layer 25 are provided between two adjacent diode trench gates 21. The p⁺-type contact layer 24 includes, for example, boron or aluminum as a p-type impurity. Concentration of the p-type impurity of the p⁺-type contact layer 24 is $1.0\times10^{15}/cm^3$ to $1.0\times10^{20}/cm^3$. The p-type anode layer 25 includes, for example, boron or aluminum as a p-type impurity. Concentration of the p-type impurity is $1.0\times10^{12}/cm^3$ to $1.0\times10^{19}/cm^3$. The p⁺-type contact layer 24 and the p-type anode layer 25 are alternately provided in a longitudinal direction of the diode trench gate 21.

The diode region 20 includes the n⁻-type drift layer 1 in a similar manner to the IGBT region 10. The n⁻-type drift layer 1 of the diode region 20 is continuous in an integrated manner with the n⁻-type drift layer 1 in the IGBT region 10. In FIG. 7, the semiconductor substrate has a range from the p⁺-type contact layer 24 to the n⁺-type cathode layer 26. In FIG. 7, an upper end of the p⁺-type contact layer 24 in the drawing will be referred to as the upper surface of the semiconductor substrate, and a lower end of the n⁺-type cathode layer 26 in the drawing will be referred to as the back surface of the semiconductor substrate. The upper surface of the diode region 20 is in the same plane with the upper surface of the IGBT region 10. Further, the back surface of the diode region 20 is in the same plane with the back surface of the IGBT region 10.

Also in the diode region 20, in a similar manner to the IGBT region 10, the n-type carrier accumulation layer 2 is provided on the upper surface side of the n⁻-type drift layer 1, and the n-type buffer layer 3 is provided on the back surface side of the n⁻-type drift layer 1. The n-type carrier accumulation layer 2 and the n-type buffer layer 3 in the diode region 20 have the same configurations as those of the n-type carrier accumulation layer 2 and the n-type buffer layer 3 in the IGBT region 10. Even in a case where the n-type carrier accumulation layer 2 is provided in the IGBT region 10, the n-type carrier accumulation layer 2 does not have to be provided in the diode region 20. Further, in a similar manner to the IGBT region 10, the n⁻-type drift layer 1, the n-type carrier accumulation layer 2 and the n-type buffer layer 3 may be collectively referred to as a drift layer.

The p-type anode layer 25 is provided on the upper surface side of the n-type carrier accumulation layer 2. The p-type anode layer 25 is provided between the n⁻-type drift layer 1 and the upper surface of the semiconductor substrate. The p-type anode layer 25 and the p-type base layer 15 in the IGBT region 10 may have the same concentration of the p-type impurity. The p-type anode layer 25 and the p-type base layer 15 may be formed at the same time.

The p⁺-type contact layer 24 is provided on the upper surface side of the p-type anode layer 25. Concentration of the p-type impurity of the p⁺-type contact layer 24 may be the same as or different from concentration of the p-type impurity of the p⁺-type contact layer 14 of the IGBT region 10. The p⁺-type contact layer 24 constitutes the upper surface of the semiconductor substrate. Note that the p⁺-type contact layer 24 has higher concentration of the p-type impurity than concentration of the p-type impurity of the p-type anode layer 25. In a case where it is necessary to distinguish the p⁺-type contact layer 24 from the p-type anode layer 25, they may be individually referred to as the p⁺-type contact layer 24 and the p-type anode layer 25. The p⁺-type contact layer 24 and the p-type anode layer 25 may be collectively referred to as a p-type anode layer.

In the diode region 20, an n⁺-type cathode layer 26 is provided on the back surface side of the n-type buffer layer 3. The n⁺-type cathode layer 26 is provided between the n⁻-type drift layer 1 and the back surface of the semiconductor substrate. The n⁺-type cathode layer 26 includes, for example, arsenic or phosphorus as an n-type impurity. Concentration of the n-type impurity of the n⁺-type cathode layer 26 is $1.0 \times 10^{16}/cm^3$ to $1.0 \times 10^{21}/cm^3$. The n⁺-type cathode layer 26 is provided in part or all of the diode region 20. The n⁺-type cathode layer 26 constitutes the back surface of the semiconductor substrate.

While not illustrated, the p-type impurity may be further selectively injected to the region where the n⁺-type cathode layer 26 is formed. By this means, a p⁺-type cathode layer is provided in part of the n⁺-type cathode layer 26. The n⁺-type cathode layer and the p⁺-type cathode layer may be alternately provided along the back surface of the semiconductor substrate. Such a diode is referred to as a relaxed field of cathode (RFC) diode.

In the diode region 20, the trench pierces the p-type anode layer 25 from the upper surface of the semiconductor substrate and reaches the n⁻-type drift layer 1. The diode trench electrode 21a faces the n⁻-type drift layer 1 via the diode trench insulating film 21b.

As illustrated in FIG. 7, the barrier metal 5 is provided on the diode trench electrode 21a and the p⁺-type contact layer 24. The barrier metal 5 is brought into ohmic contact with and electrically connected to the diode trench electrode 21a and the p⁺-type contact layer 24. The barrier metal 5 may have the same configuration as the configuration of the barrier metal 5 in the IGBT region 10. The emitter electrode 6 is provided on the barrier metal 5. The emitter electrode 6 provided in the diode region 20 is formed so as to be continuous with the emitter electrode 6 provided in the IGBT region 10.

Note that in a similar manner to a case of the IGBT region 10, the diode trench electrode 21a and the p⁺-type contact layer 24 may be brought into ohmic contact with the emitter electrode 6 without the barrier metal 5 being provided. In FIG. 7, the inter-layer insulating film 4 is not provided on the diode trench electrode 21a. The configuration is not limited to this, and the inter-layer insulating film 4 may be formed on the diode trench electrode 21a. In this case, the emitter electrode 6 only requires to be electrically connected to the diode trench electrode 21a in another cross-section.

The collector electrode 7 is provided on the back surface side of the n⁺-type cathode layer 26. The collector electrode 7 of the diode region 20 is formed so as to be continuous with the collector electrode 7 provided in the IGBT region 10. The collector electrode 7 is brought into ohmic contact with and electrically connected to the n⁺-type cathode layer 26.

Unlike the cross-section C-C illustrated in FIG. 7, the p⁺-type contact layer 24 does not appear in the cross-section D-D illustrated in FIG. 8. In other words, the p-type anode layer 25 constitutes the upper surface of the semiconductor substrate. The p⁺-type contact layer 24 is selectively provided on the upper surface side of the p-type anode layer 25.

As illustrated in FIG. 7 and FIG. 8, a lifetime control region 50 is provided on the back surface side relative to the center in a thickness direction of the semiconductor substrate among the n⁻-type drift layer 1 in the diode region 20. The lifetime control region 50 has higher crystal defect density than that of other portions of the n⁻-type drift layer 1 and includes protons. The other portions are portions on the upper surface side relative to a region where a crystal defect V is formed among the n⁻-type drift layer 1. Details of the lifetime control region 50 will be described later.

Figure 9:
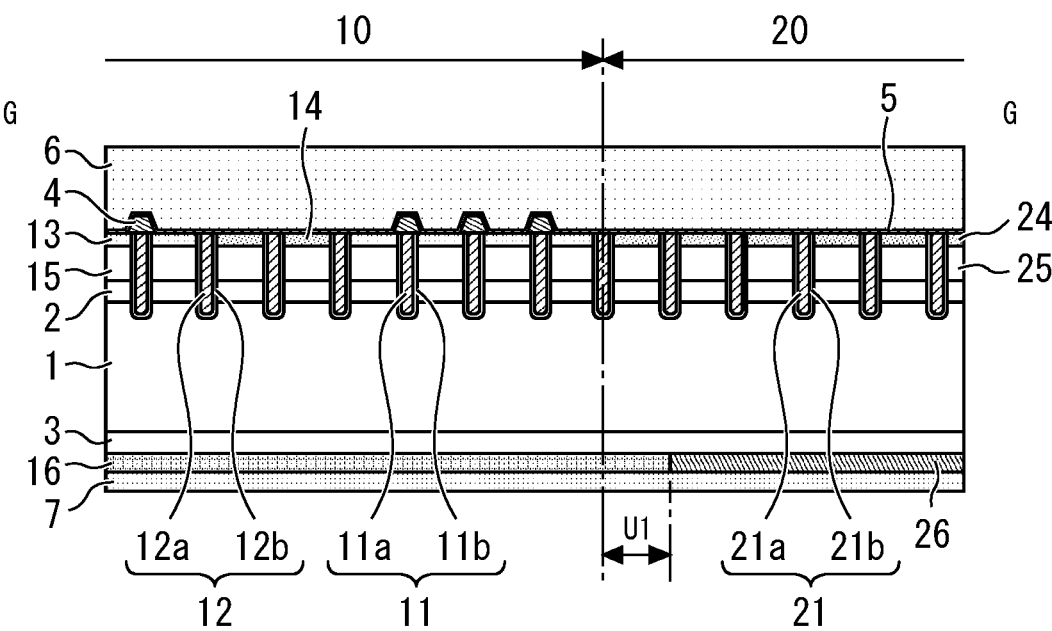
FIG. 9 is a cross-sectional diagram illustrating a configuration of a boundary of the IGBT region and the diode region according to the first embodiment.

FIG. 9 is a cross-sectional diagram illustrating a configuration of a boundary of the IGBT region 10 and the diode region 20 according to the first embodiment. Note that in FIG. 9, the lifetime control region 50 is omitted. FIG. 9 is a cross-sectional diagram obtained by cutting FIG. 1 or FIG. 2 along a line G-G. The p-type collector layer 16 provided in the IGBT region 10 protrudes on the diode region 20 side by a distance U1 from the boundary of the IGBT region 10 and the diode region 20. This can make a distance between the n⁺-type cathode layer 26 and the active trench gate 11 greater. Thus, in a case where a gate drive voltage is applied to the gate trench electrode 11a during freewheeling diode operation, it is possible to prevent a current from flowing through the n⁺-type cathode layer 26 from a channel formed adjacent to the active trench gate 11 in the IGBT region 10. The distance U1 is, for example, 100 μm. Note that the distance U1 may be zero or a distance less than 100 μm depending on applications of the semiconductor device 100 or the semiconductor device 101.

Figures 10, 11:
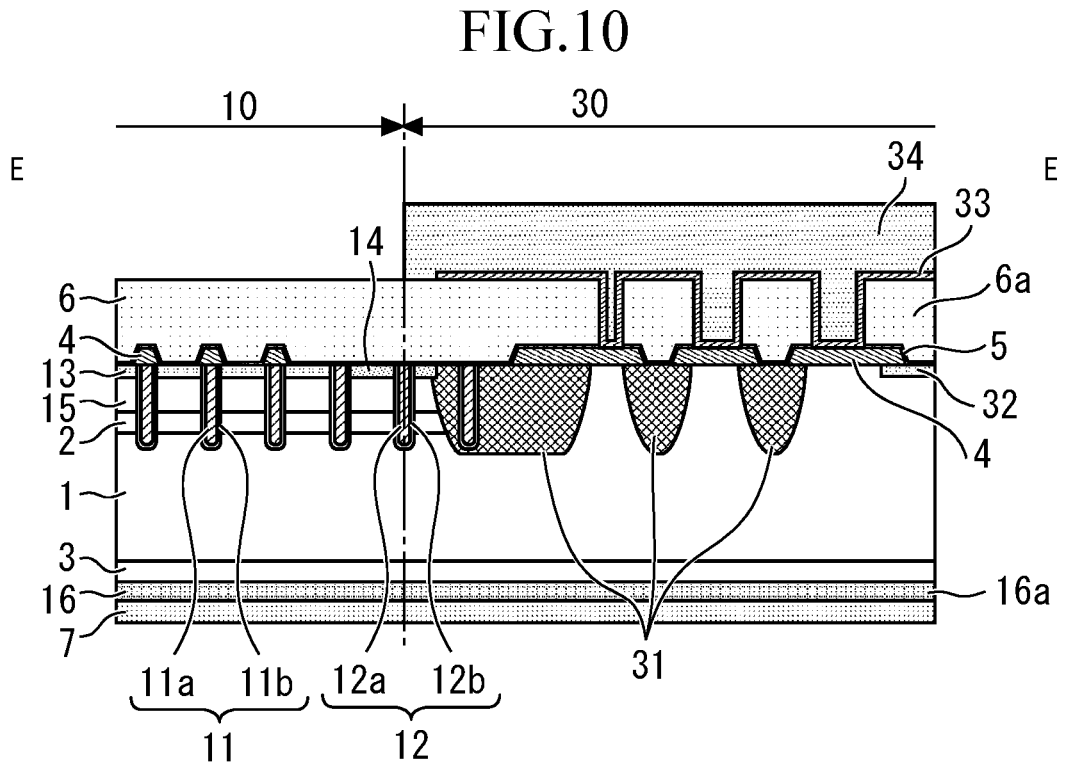
FIG. 10 and FIG. 11 are cross-sectional diagrams illustrating a configuration of the termination region according to the first embodiment.

FIG. 10 and FIG. 11 are cross-sectional diagrams illustrating a configuration of the termination region 30 according to the first embodiment. FIG. 10 is a cross-sectional diagram obtained by cutting FIG. 1 or FIG. 2 along a line E-E. FIG. 11 is a cross-sectional diagram obtained by cutting FIG. 1 along a line F-F. The termination region 30 includes the n⁻-type drift layer 1. The upper surface and the back surface of the termination region 30 are respectively in the same plane with the upper surface and the back surface of the IGBT region 10 and the diode region 20. Further, the n⁻-type drift layer 1 in the termination region 30 has the same configuration as the configurations of the n– drift layers 1 in the IGBT region 10 and the diode region 20. The n⁻-type drift layer 1 in the termination region 30, the IGBT region 10 and the diode region 20 is formed so as to be continuous in an integrated manner.

In the termination region 30, a p-type termination well layer 31 is provided on the upper surface side of the n⁻-type drift layer 1. The p-type termination well layer 31 includes, for example, boron or aluminum as a p-type impurity. Concentration of the p-type impurity of the p-type termination well layer 31 is $1.0{\times}10^{14}/\mathrm{cm}^3$ to $1.0{\times}10^{19}/\mathrm{cm}^3$. The p-type termination well layer 31 surrounds the cell region. The p-type termination well layer 31 is provided in a pattern of a plurality of rings. Further, an n⁺-type channel stopper layer 32 is provided on a further outer edge side of the p-type termination well layer 31. The n⁺-type channel stopper layer 32 surrounds the p-type termination well layer 31.

A p-type termination collector layer 16a is provided between the n⁻-type drift layer 1 and the back surface of the semiconductor substrate. The p-type termination collector layer 16a is formed so as to be continuous in an integrated manner with the p-type collector layer 16 provided in the cell region. Thus, the p-type termination collector layer 16a and the p-type collector layer 16 may be collectively referred to as the p-type collector layer 16.

In the semiconductor device 100, the diode region 20 is adjacent to the termination region 30. In such a configuration, as illustrated in FIG. 11, an end portion on the diode region 20 side of the p-type termination collector layer 16a is provided so as to protrude to the diode region 20 by a distance U2. This can make a distance between the n⁺-type cathode layer 26 and the p-type termination well layer 31 greater. It is therefore possible to prevent the p-type termination well layer 31 from operating as an anode of the diode. The distance U2 is, for example, 100 μm.

In the termination region 30, a collector electrode 7 is provided on the back surface of the semiconductor substrate. The collector electrode 7 is formed so as to be continuous in an integrated manner from the cell region to the termination region 30. On the other hand, the emitter electrode 6 that is continuous from the cell region and the termination electrode 6a separated from the emitter electrode 6 are provided in the termination region 30 on the upper surface of the semiconductor substrate.

The emitter electrode 6 is electrically connected to the termination electrode 6a via a semi-insulating film 33. The semi-insulating film 33 is, for example, semi-insulating silicon nitride (sinSiN). The p-type termination well layer 31 and the n⁺-type channel stopper layer 32 are electrically connected to the termination electrode 6a via contact holes formed in the inter-layer insulating film 4 provided on the upper surface of the termination region 30. Further, in the termination region 30, a termination protective film 34 that covers the emitter electrode 6, the termination electrode 6a and the semi-insulating film 33 is provided. The termination protective film 34 is formed with, for example, polyimide.

A method for manufacturing the semiconductor devices 100 and 101 will be described next. FIG. 12 to FIG. 23 are diagrams illustrating a method for manufacturing the semiconductor device according to the first embodiment. FIG. 12 to FIG. 19 illustrate processes of forming the upper surface side of the semiconductor device 100 or the semiconductor device 101, and FIG. 20 to FIG. 23 illustrate processes of forming the back surface side of the semiconductor device 100 or the semiconductor device 101.

Figure 12:
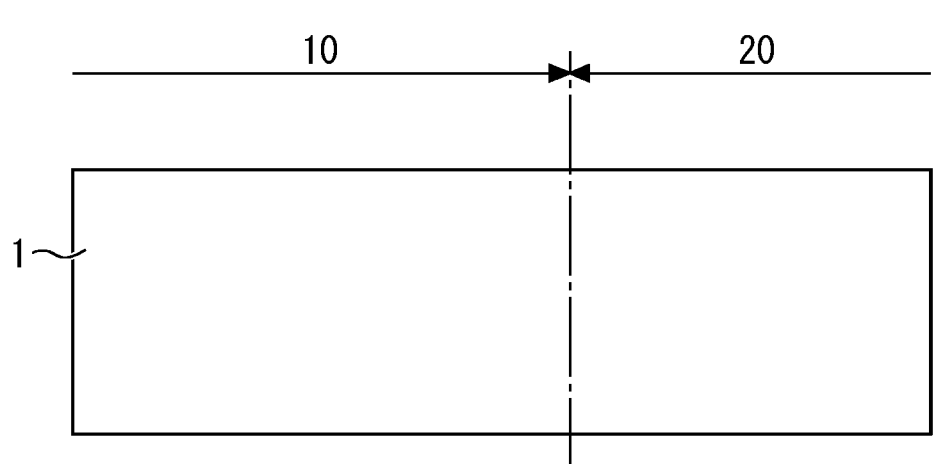
FIG. 12 to FIG. 23 are diagrams illustrating a method for manufacturing the semiconductor device according to the first embodiment.

First, as illustrated in FIG. 12, a semiconductor substrate including the n⁻-type drift layer 1 is prepared. As the semiconductor substrate, for example, a so-called FZ wafer manufactured using a floating zone (FZ) method or a so-called MCZ wafer manufactured using a magnetic applied CZochralki (MCZ) method, can be used. The semiconductor substrate only requires to be an n-type wafer including an n-type impurity. Concentration of the n-type impurity included in the semiconductor substrate is selected as appropriate in accordance with a withstand voltage of the semiconductor device. For example, the concentration of the n-type impurity is adjusted so that specific resistance of the n⁻-type drift layer 1 becomes approximately 40 to 120 Ω·cm in the semiconductor device having a withstand voltage of 1200 V.

In the process of preparing the semiconductor substrate, the whole of the semiconductor substrate is the n⁻-type drift layer 1. P-type or n-type impurity ions are implanted from the upper surface side or the back surface side of such a semiconductor substrate and spread within the semiconductor substrate through heat treatment, or the like. As a result of this, a p-type or n-type semiconductor layer is formed.

The semiconductor substrate includes regions that become the IGBT region 10 and the diode region 20. Further, while not illustrated, a region that becomes the termination region 30 is provided around the regions that become the IGBT region 10 and the diode region 20. In the following description, a method for manufacturing the IGBT region 10 and the diode region 20 will be mainly described. The termination region 30 may be manufactured using a well-known manufacturing method. For example, the FLR may be formed as the withstand voltage holding structure by implanting p-type impurity ions to the termination region 30 before the IGBT region 10 and the diode region 20 are processed. Alternatively, the termination region 30 may be formed by implanting p-type impurity ions to the termination region 30 at the same time as p-type impurity ions are implanted to the IGBT region 10 or the diode region 20.

Figure 13:
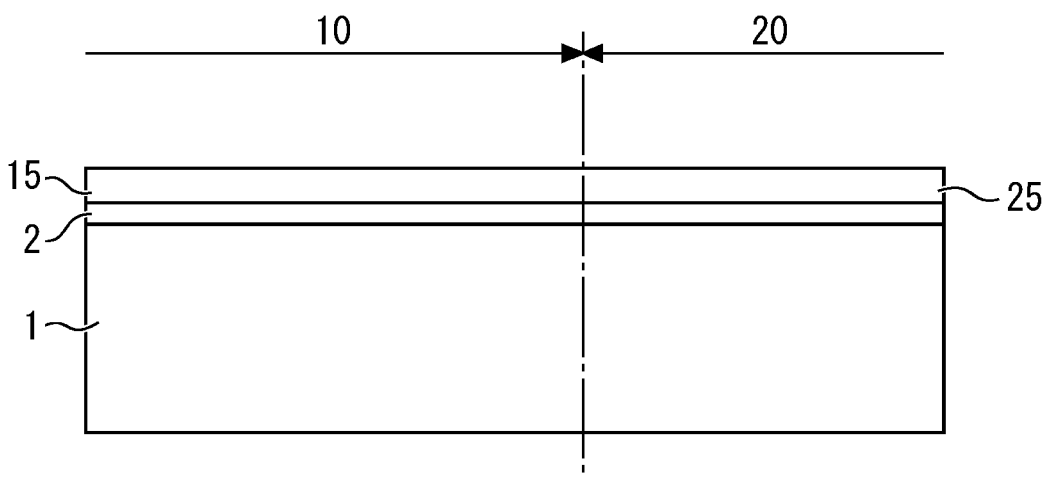

Then, as illustrated in FIG. 13, the n-type carrier accumulation layer 2 is formed by implanting an n-type impurity such as phosphorus from the upper surface side of the semiconductor substrate. Further, the p-type base layer 15 and the p-type anode layer 25 are formed by implanting a p-type impurity such as boron from the upper surface side of the semiconductor substrate. The n-type carrier accumulation layer 2, the p-type base layer 15 and the p-type anode layer 25 are formed by implanting impurity ions within the semiconductor substrate and then spreading the impurity ions through heat treatment.

The n-type impurity ions and the p-type impurity ions are implanted after the upper surface of the semiconductor substrate is subjected to mask processing. Thus, these layers are selectively formed on the upper surface side of the semiconductor substrate. The n-type carrier accumulation layer 2, the p-type base layer 15 and the p-type anode layer 25 are connected to the p-type termination well layer 31 in the termination region 30. Note that in the mask processing, a resist is applied on the semiconductor substrate, and openings are formed in regions of the resist, determined in advance using a photolithography technology. Ions are implanted or etching is performed in the regions determined in advance on the semiconductor substrate via the openings.

The p-type base layer 15 and the p-type anode layer 25 may be formed by implanting p-type impurity ions at the same time. In this case, depths and concentration of the p-type impurity become the same between the p-type base layer 15 and the p-type anode layer 25. Alternatively, the p-type impurity ions may be separately implanted to the p-type base layer 15 and the p-type anode layer 25 through mask processing. The depths or the concentration of the p-type impurity may be made different between the p-type base layer 15 and the p-type anode layer 25 by this.

Further, the p-type termination well layer 31 may be formed by implanting the p-type impurity ions at the same time as p-type impurity ions are implanted to the p-type anode layer 25. In this case, depths and concentration of the p-type impurity become the same between the p-type termination well layer 31 and the p-type anode layer 25. Further, a mask to be used for forming one or both of the p-type termination well layer 31 and the p-type anode layer 25 may be made in a mesh pattern. By this means, an aperture ratio can be changed. Thus, even in a case where the p-type termination well layer 31 and the p-type anode layer 25 are formed by implanting ions at the same time, it is possible to make concentration of the p-type impurity of the p-type termination well layer 31 different from concentration of the p-type impurity of the p-type anode layer 25.

Further, ions may be separately implanted to the p-type termination well layer 31 and the p-type anode layer 25 through mask processing. Depths or concentration of the p-type impurity may be made different between the p-type termination well layer 31 and the p-type anode layer 25 by this. The p-type termination well layer 31, the p-type base layer 15 and the p-type anode layer 25 may be formed by implanting ions at the same time.

Figure 14:
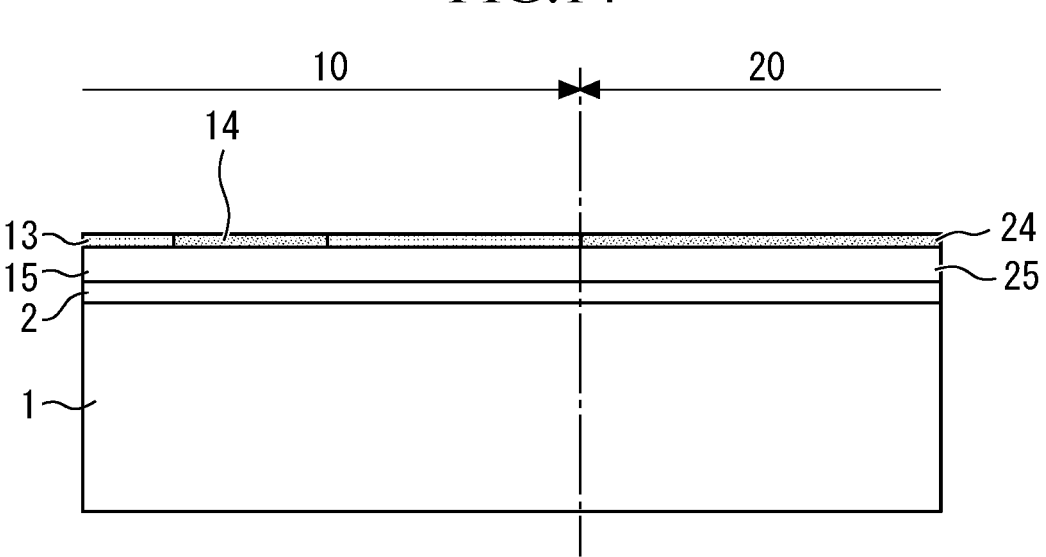

Then, the n-type impurity is selectively implanted on the upper surface side of the p-type base layer 15 through mask processing. As a result of this, as illustrated in FIG. 14, the $n^+$-type source layer 13 is formed. The n-type impurity to be implanted is, for example, arsenic or phosphorus. Further, the p-type impurity is selectively implanted on the upper surface side of the p-type base layer 15 through mask processing. As a result of this, the $p^+$-type contact layer 14 is formed. Further, the p-type impurity is selectively implanted on the upper surface side of the p-type anode layer 25. As a result of this, the $p^+$-type contact layer 24 is formed. The p-type impurity to be implanted is, for example, boron or aluminum.

Figure 15:
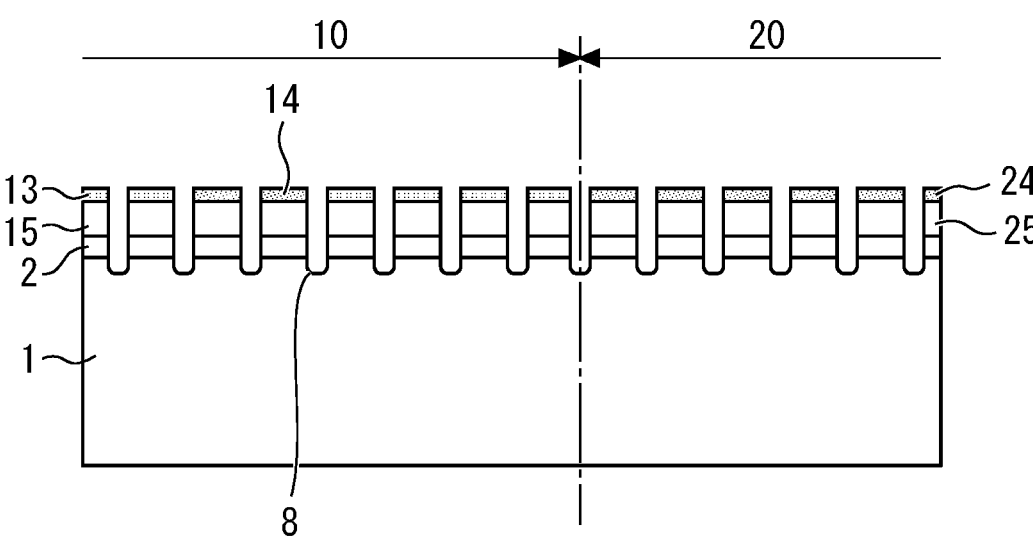

Then, as illustrated in FIG. 15, the trenches 8 that pierce through the p-type base layer 15 and the p-type anode layer 25 from the upper surface side of the semiconductor substrate and reach the $n^-$-type drift layer 1 are formed. Side walls of the trenches 8 that pierce through the $n^+$-type source layer 13 constitute part of the $n^+$-type source layer 13. As a method for forming the trenches 8, first, an oxide film such as SiO2 is deposited on the semiconductor substrate. Then, openings are formed in the oxide film at portions where the trenches 8 are to be formed through mask processing. Then, the semiconductor substrate is etched using the oxide film in which the openings are formed as a mask.

In FIG. 15, a pitch of the trenches 8 is the same between in the IGBT region 10 and in the diode region 20. The pitch of the trenches 8 may be different between in the IGBT region 10 and in the diode region 20. The pitch of the trenches 8 can be changed as appropriate by a mask pattern of the mask processing.

Figure 16:
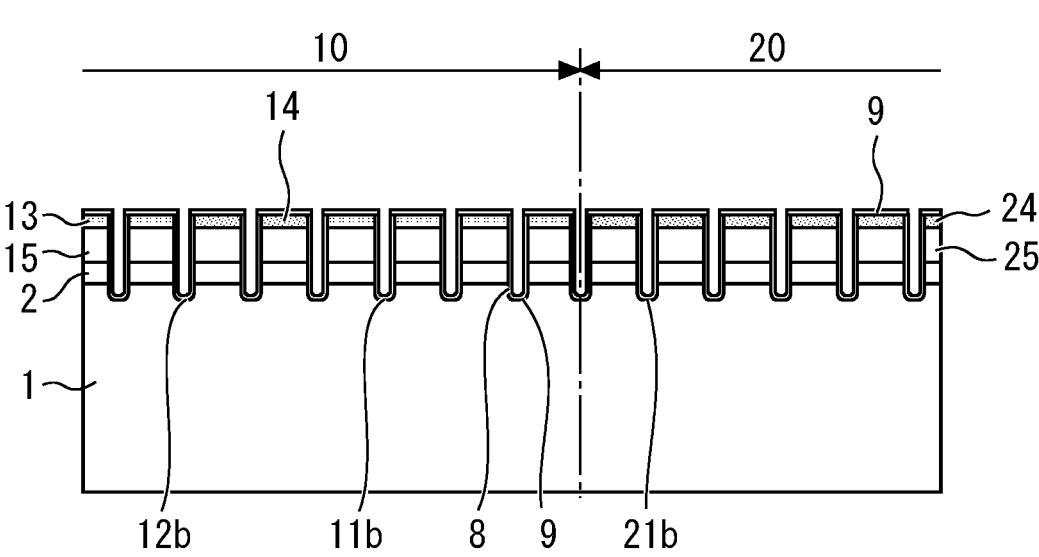

Then, as illustrated in FIG. 16, an oxide film 9 is formed on inner walls of the trenches 8 and the upper surface of the semiconductor substrate by heating the semiconductor substrate in an atmosphere including oxygen. The oxide film 9 formed in the trenches 8 in the IGBT region 10 is the gate trench insulating film 11*b* and the dummy trench insulating film 12*b*. Further, the oxide film 9 formed in the trenches 8 in the diode region 20 is the diode trench insulating film 21*b*. The oxide film 9 formed on the upper surface of the semiconductor substrate is removed in the later process.

Figure 17:
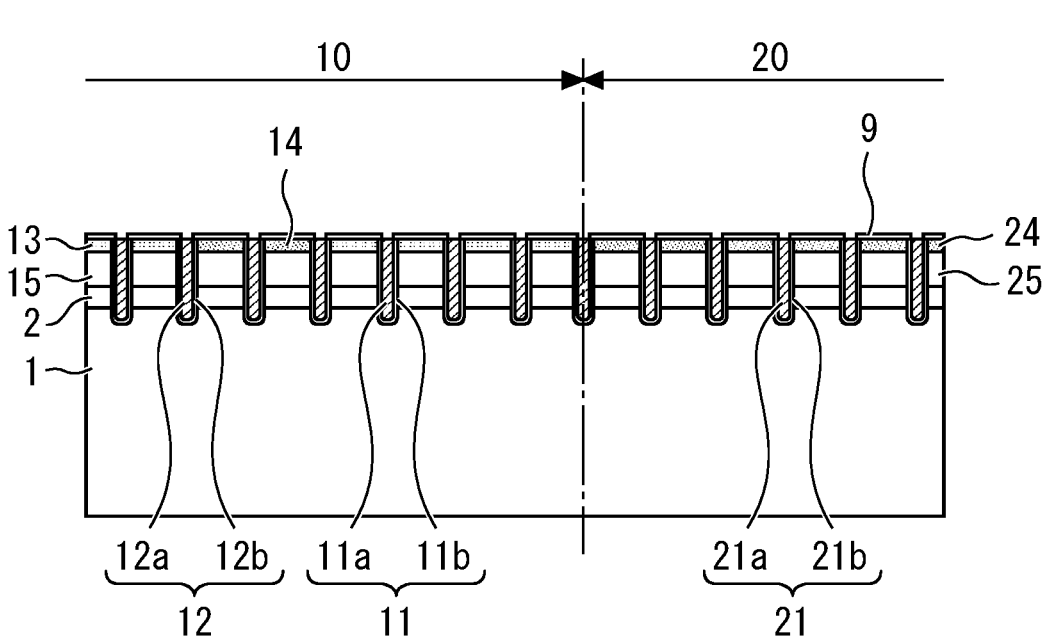

Then, as illustrated in FIG. 17, polysilicon doped with an n-type or p-type impurity is deposited within the trenches 8 through chemical vapor deposition (CVD), or the like. By this means, the gate trench electrode 11*a*, the dummy trench electrode 12*a* and the diode trench electrode 21*a* are formed.

Figure 18:
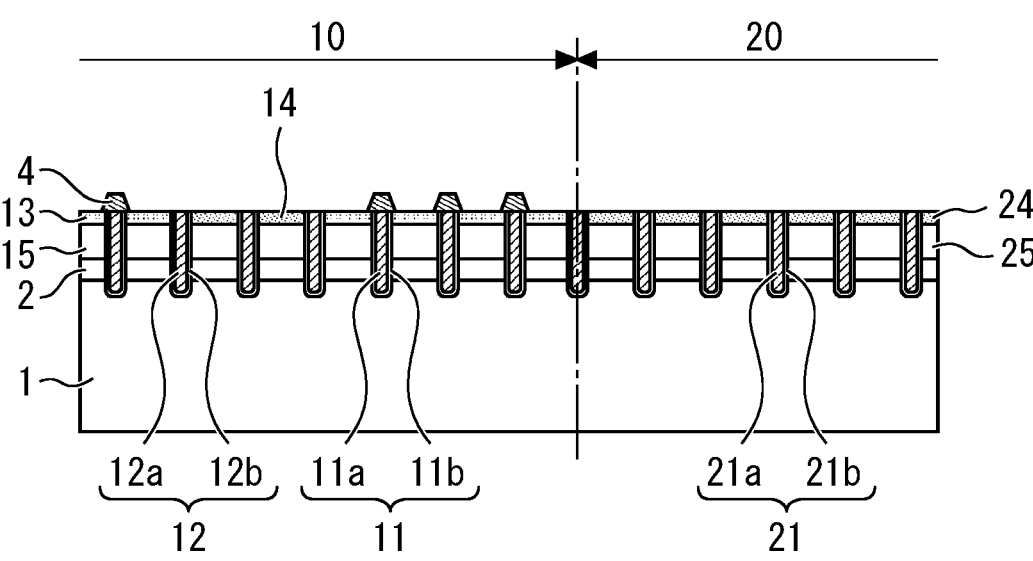

Then, as illustrated in FIG. 18, the inter-layer insulating film 4 is formed on the gate trench electrode 11*a*. Then, the oxide film 9 formed on the upper surface of the semiconductor substrate is removed. The inter-layer insulating film 4 is, for example, SiO2. Then, the contact holes are formed in the inter-layer insulating film 4 through mask processing. The contact holes are formed on the $n^+$-type source layer 13, the $p^+$-type contact layer 14, the $p^+$-type contact layer 24, the dummy trench electrode 12*a* and the diode trench electrode 21*a*.

Figure 19:
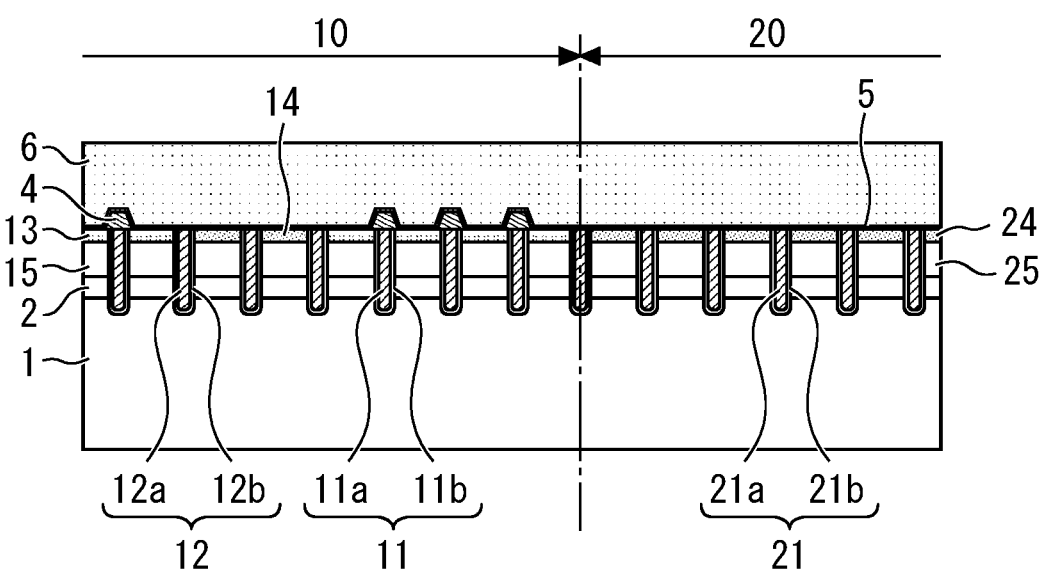

Then, as illustrated in FIG. 19, the barrier metal 5 is formed on the upper surface of the semiconductor substrate and the inter-layer insulating film 4. Further, the emitter electrode 6 is formed on the barrier metal 5. The barrier metal 5 is formed by depositing titanium nitride through physical vapor deposition (PVD) or CVD.

The emitter electrode 6 is formed, for example, by depositing an aluminum-silicon alloy on the barrier metal 5 through PVD such as sputtering or vapor deposition. Further, a nickel alloy may be further formed on the aluminum-silicon alloy through non-electrolytic plating or electrolytic plating. Plating processing for forming the nickel alloy may be performed after processing on the back surface side of the semiconductor substrate is performed. A thick metal film can be easily formed as the emitter electrode 6 through plating. It is therefore possible to increase heat capacity of the emitter electrode 6 and improve heat resistance.

Figure 20:
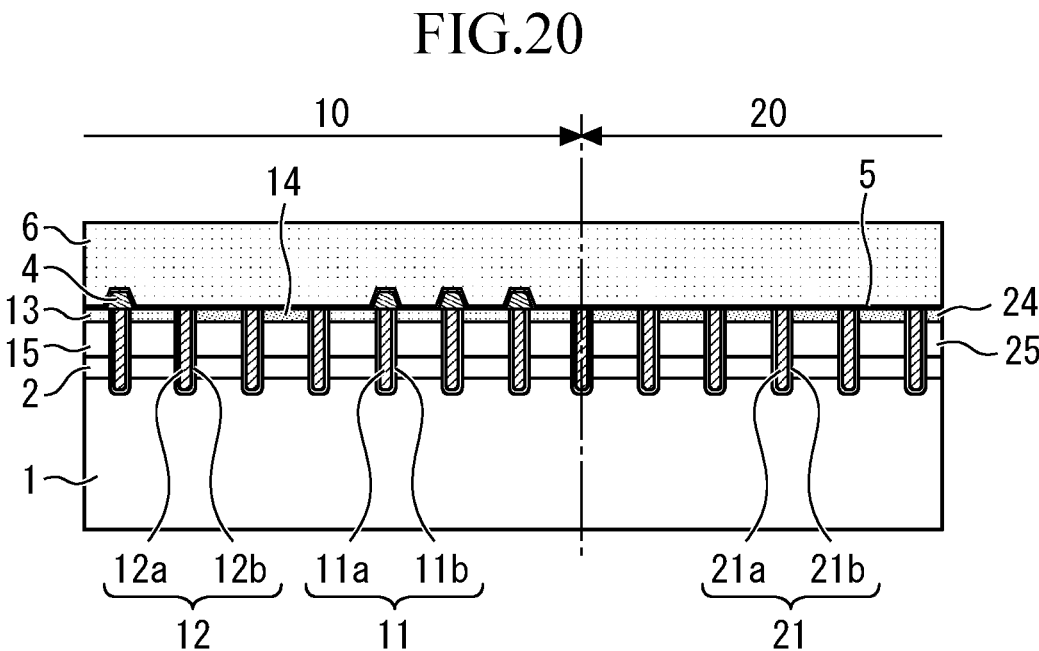

Then, as illustrated in FIG. 20, the semiconductor substrate is made thinner to achieve a designed thickness by grinding the back surface side of the semiconductor substrate. The thickness of the grounded semiconductor substrate is, for example, 80 μm to 200 μm. The thickness of the semiconductor substrate may be determined in accordance with the withstand voltage of the semiconductor device.

Figure 21:
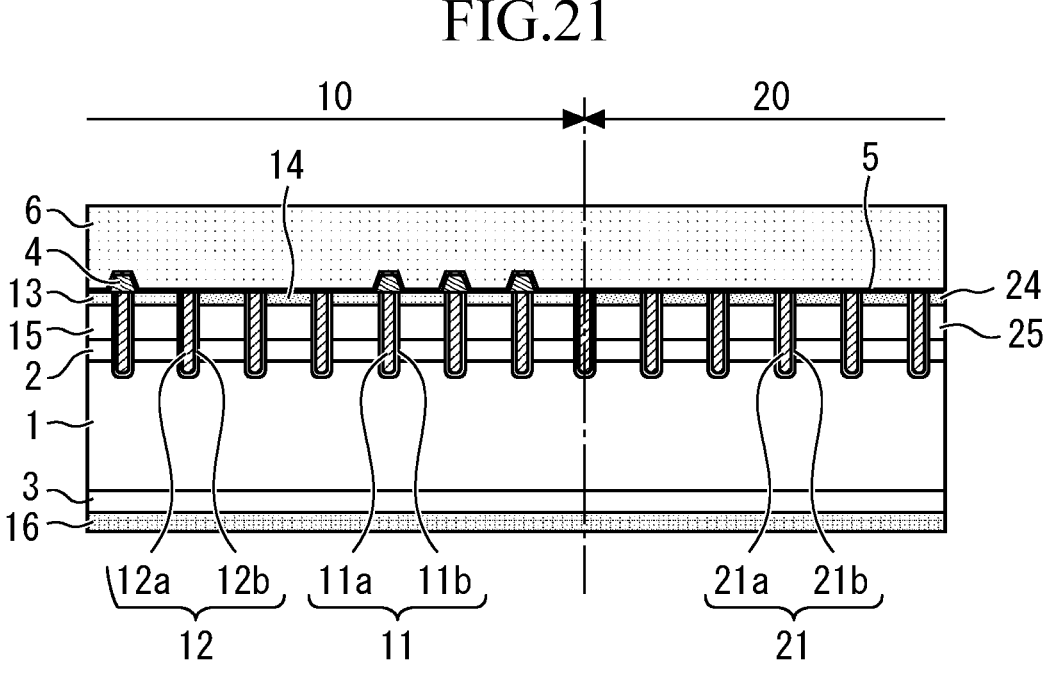

Then, as illustrated in FIG. 21, an n-type impurity is implanted from the back surface side of the semiconductor substrate to form the n-type buffer layer 3. Further, a p-type impurity is implanted from the back surface side of the semiconductor substrate to form the p-type collector layer 16. The n-type buffer layer 3 may be formed in the IGBT region 10, the diode region 20 and the termination region 30. The n-type buffer layer 3 may be formed only in the IGBT region 10 or the diode region 20.

The n-type buffer layer 3 is formed, for example, by implanting phosphorus ions. The n-type buffer layer 3 may be formed by injecting protons. The n-type buffer layer 3 may be formed by injecting both protons and phosphorus. Protons can be injected to a deep position from the back surface of the semiconductor substrate at low acceleration energy. Further, the depth to which protons are injected can be easily changed by changing the acceleration energy. In a case where the n-type buffer layer 3 is formed with protons, protons may be injected a plurality of times while changing the acceleration energy. This can form the n-type buffer layer 3 with a wider width in the thickness direction of the semiconductor substrate than a width in a case where the n-type buffer layer 3 is formed with phosphorus.

Further, phosphorus can make an activation rate of the n-type impurity higher than protons. By forming the n-type buffer layer 3 with phosphorus, it is possible to reliably prevent punch-through of the depletion layer even if the semiconductor substrate is made thinner. It is preferable to form the n-type buffer layer 3 by injecting both protons and phosphorus to make the semiconductor substrate further thinner. In this event, protons are injected to a deeper position from the back surface than a position to which phosphorus is implanted.

The p-type collector layer 16 is formed, for example, by implanting boron. The p-type collector layer 16 is formed also in the termination region 30 as the p-type termination collector layer 16a. The implanted boron is activated by implanting ions from the back surface side of the semiconductor substrate and then irradiating the back surface with laser to perform laser annealing. As a result of this, the p-type collector layer 16 is formed. In this event, phosphorus for the n-type buffer layer 3 implanted to a shallow position from the back surface of the semiconductor substrate is also activated at the same time.

On the other hand, protons are activated at a low anneal temperature from 350° C. to 500° C. It is therefore necessary to pay attention so that a temperature of the whole semiconductor substrate does not become a temperature higher than 350° C. to 500° C. in processes other than a process for activating protons after the protons are injected. In laser annealing, only a temperature of a portion near the back surface of the semiconductor substrate can be made a high temperature. It is therefore possible to use laser annealing in activation of the n-type impurity or the p-type impurity even after protons are injected.

Figure 22:
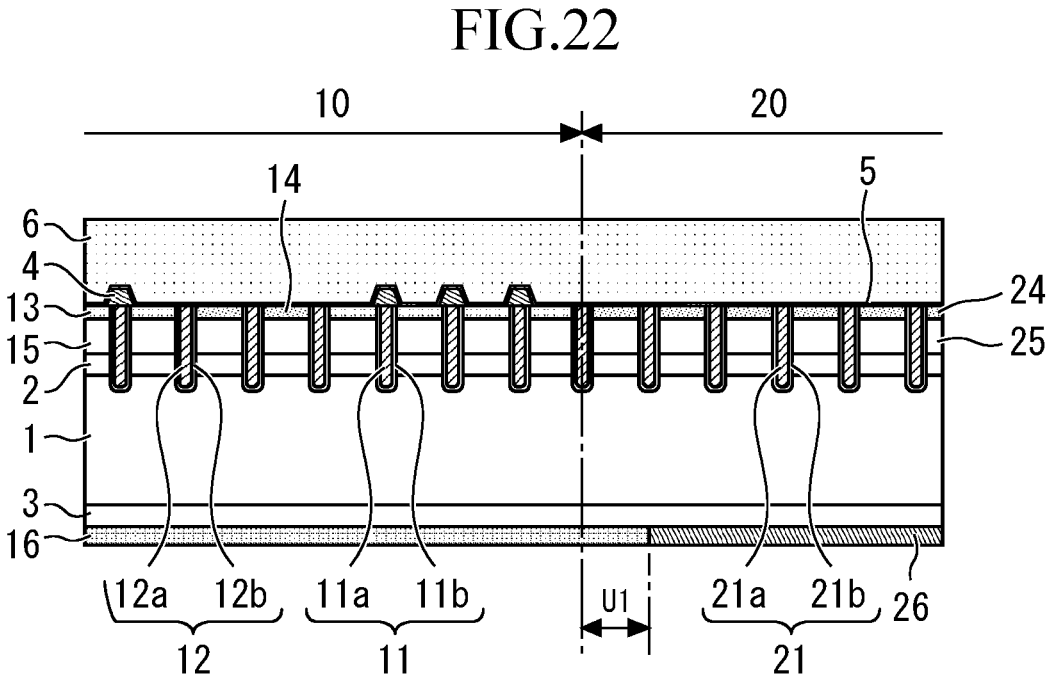

Then, as illustrated in FIG. 22, the $n^+$-type cathode layer 26 is formed in the diode region 20. The $n^+$-type cathode layer 26 is formed, for example, by implanting phosphorus. Phosphorus is selectively implanted from the back surface side through mask processing. By this means, a boundary of the p-type collector layer 16 and the $n^+$-type cathode layer 26 is set at a position separated from the boundary of the IGBT region 10 and the diode region 20 to the diode region 20 side by the distance U1. An amount of the n-type impurity to be implanted for forming the $n^+$-type cathode layer 26 is larger than an amount of the p-type impurity to be implanted for forming the p-type collector layer 16.

In FIG. 22, a depth of the p-type collector layer 16 from the back surface is the same as a depth of the $n^+$-type cathode layer 26 from the back surface. Actually, the depth of the $n^+$-type cathode layer 26 is equal to or greater than the depth of the p-type collector layer 16. In a region where the $n^+$-type cathode layer 26 is to be formed, it is necessary to make an n-type semiconductor by implanting the n-type impurity to a region where the p-type impurity is implanted. Thus, concentration of the implanted n-type impurity is made higher than concentration of the p-type impurity in all the regions where the $n^+$-type cathode layer 26 is formed.

Note that in the manufacturing processes illustrated in FIG. 21 and FIG. 22, a process of forming the lifetime control region 50 is omitted. A method for forming the lifetime control region 50 will be described later.

Figure 23:
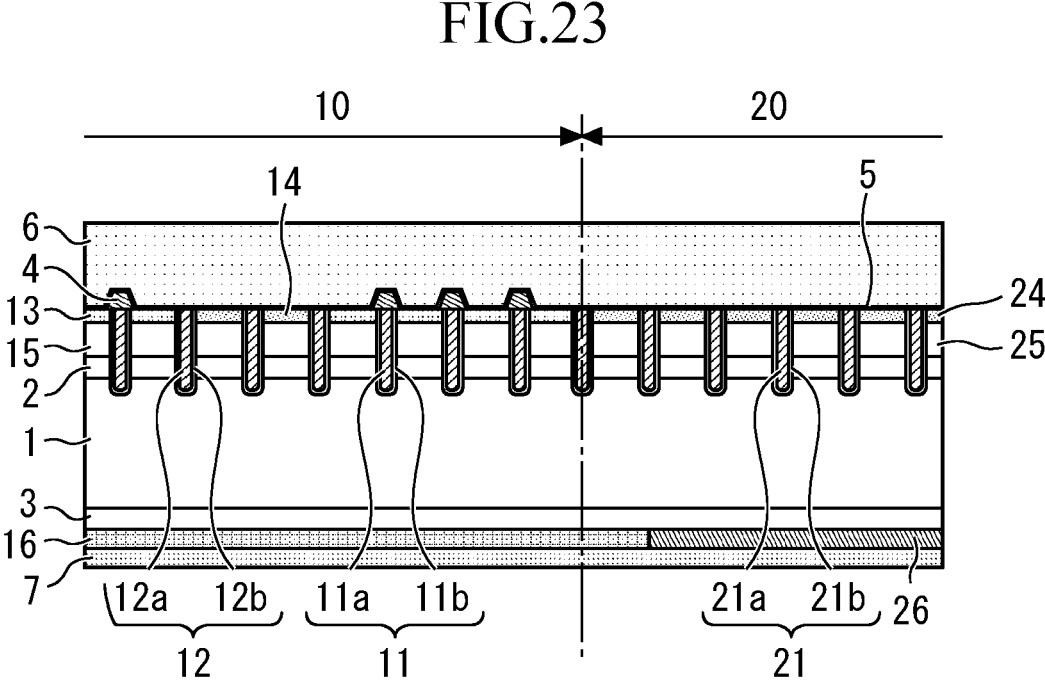

Then, as illustrated in FIG. 23, the collector electrode 7 is formed on the back surface of the semiconductor substrate. The collector electrode 7 is formed over the whole back surface of the IGBT region 10, the diode region 20 and the termination region 30. Further, the collector electrode 7 may be formed over the whole back surface of an n-type wafer that is the semiconductor substrate. The collector electrode 7 is formed by depositing an aluminum-silicon alloy, titanium, or the like, through, for example, PVD such as sputtering or vapor deposition. The collector electrode 7 may be formed by depositing a plurality of metals such as an aluminum-silicon alloy, titanium, nickel and gold. Further, the collector electrode 7 may be formed by depositing through non-electrolytic plating or electrolytic plating, a metal film on the metal film formed through PVD.

The semiconductor device 100 or the semiconductor device 101 is manufactured through the processes as described above. A plurality of semiconductor devices 100 or semiconductor devices 101 are manufactured in a matrix on one n-type wafer. The semiconductor device 100 or the semiconductor device 101 is completed by cutting the wafer into individual semiconductor devices through laser dicing or blade dicing.

Figure 24:
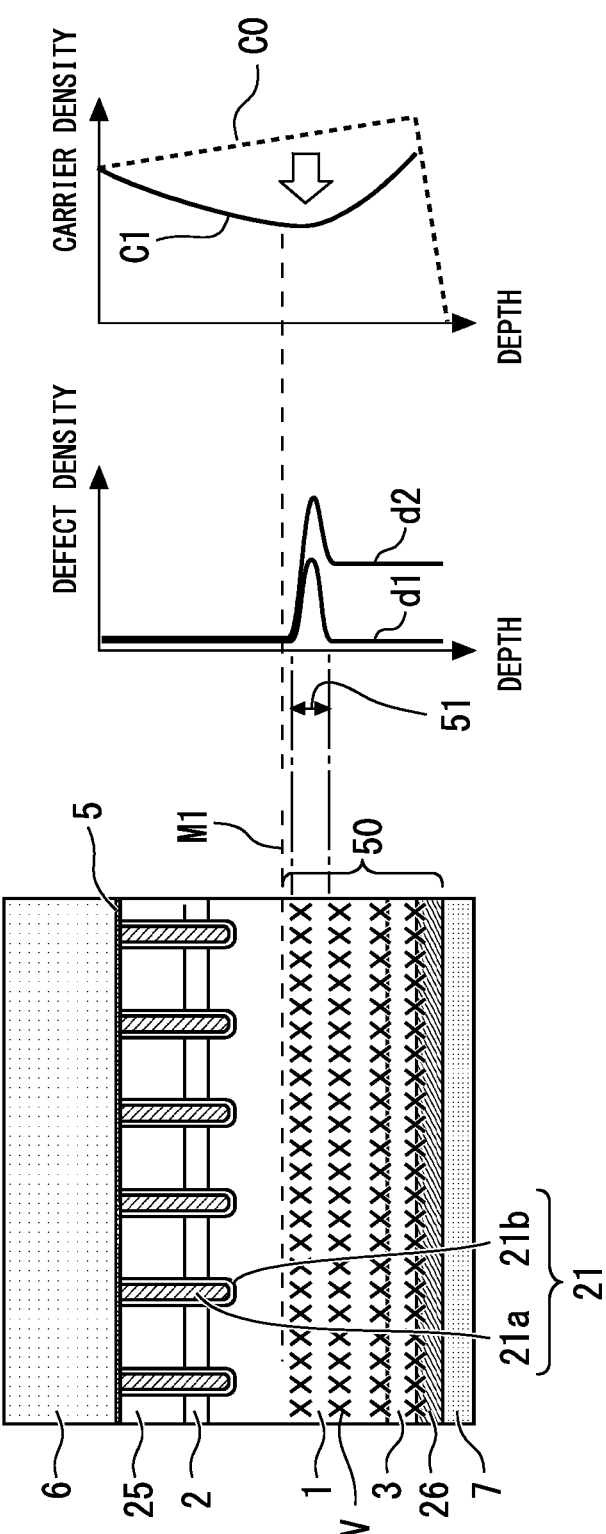
FIG. 24 is a view for explaining the lifetime control region according to the first embodiment.

The lifetime control region 50 according to the present embodiment will be described next. FIG. 24 is a view for explaining the lifetime control region 50 according to the first embodiment. The lifetime control region 50 is provided in the diode region 20 on the back surface side relative to a center M1 in the thickness direction of the semiconductor substrate. The lifetime control region 50 has density per unit volume of the crystal defect V higher than that in a portion other than the lifetime control region 50 in the $n^-$-type drift layer 1. The crystal defect V is also referred to as a carrier trap.

FIG. 24 illustrates proton density d1 and defect density d2 with respect to a position in the depth direction of the diode region. A region 51 that is part of the $n^-$-type drift layer 1 in the depth direction includes protons, that is, hydrogen ion. The crystal defect V is formed by injecting protons from the back surface side of the semiconductor substrate. The region 51 corresponds to a region where protons stop when the protons are injected. Meanwhile, the proton density d1 in a region through which protons have passed is substantially zero. Further, as indicated as the defect density d2, the crystal defect V is formed both in the region 51 where protons stop and in the region through which the protons have passed.

Further, FIG. 24 indicates carrier density with respect to a position in the depth direction of the diode region 20. C0 indicates carrier density in a case where there is no lifetime control region 50. C1 indicates carrier density in a case where the lifetime control region 50 is provided. With the lifetime control region 50, carriers to be accumulated in a region from the back surface of the semiconductor substrate to the center M1 in the thickness direction of the $n^-$-type drift layer 1 can be reduced during forward direction operation of the diode. By this means, the depletion layer is more likely to extend during recovery operation in the diode incorporated into an RC-IGBT with high current density and high carrier density. It is therefore possible to effectively reduce tail currents during recovery operation and reduce recovery losses Err.

As described above, the crystal defect V is formed on the semiconductor substrate by injecting protons. If the crystal defect V is activated, that is, turns into a donor by heat treatment, the crystal defect V binds to oxygen O and hydrogen H to form a VOH composite defect. The VOH composite defect functions as an n-type. Thus, a region to which protons are injected functions as the n-type semiconductor layer by heat treatment.

In other words, in a case where the crystal defect V is left without turning the crystal defect V into a donor, the crystal defect V performs a function of lifetime control. In a case where the crystal defect V is made to turn into a donor, the crystal defect V loses the function of lifetime control. The crystal defect V that has turned into a donor functions as an n-type layer, so that the crystal defect V can be made to function as the n-type buffer layer 3. The n-type buffer layer 3 is provided at a position deeper than the $n^+$-type cathode layer 26 on the back surface side of the $n^-$-type drift layer 1. The n-type buffer layer 3 prevents the depletion layer from extending on the $n^+$-type cathode layer 26 side from a PN junction of the p-type anode layer 25 and the $n^-$-type drift layer 1.

A maximum value of donor concentration of the $n^-$-type drift layer 1 is $1.0 \times 10^{12}/cm^3$ to $1.0 \times 10^{15}/cm^3$. Further, a maximum value of donor concentration of the lifetime control region 50 is equal to or less than $1.0 \times 10^{15}/cm^3$, and a maximum value of donor concentration of the n-type buffer layer 3 is $1.0 \times 10^{14}/cm^3$ to $1.0 \times 10^{18}/cm^3$. Note that these values of concentration indicate concentration after activation through heat treatment.

Figure 25:
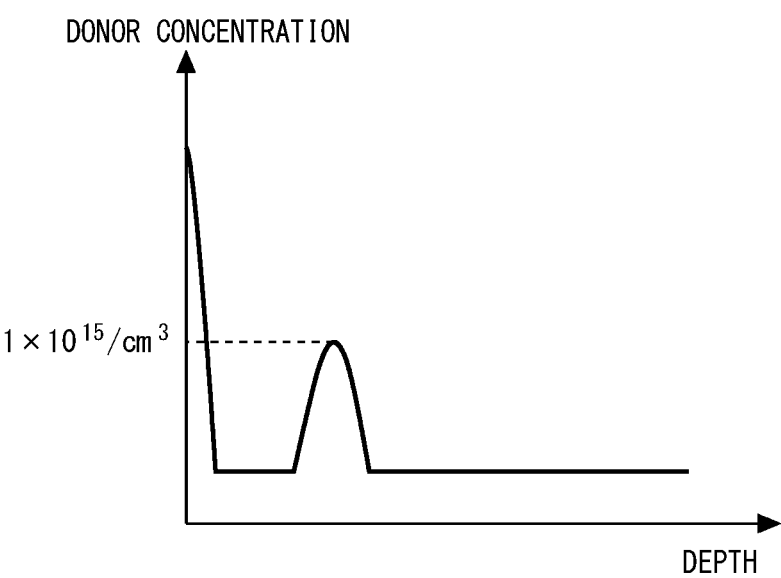
FIG. 25 is a view for explaining donor concentration according to the first embodiment.

FIG. 25 is a view for explaining donor concentration according to the first embodiment. FIG. 25 indicates a depth from the back surface of the semiconductor substrate on a horizontal axis. The maximum value of the donor concentration of the lifetime control region 50 is preferably equal to or less than $1.0 \times 10^{15}/cm^3$. Further, the maximum value of the donor concentration of the lifetime control region 50 is preferably equal to or less than 10 times of the donor concentration of a portion other than the lifetime control region 50 among the $n^-$-type drift layer 1. Here, the portion other than the lifetime control region 50 among the $n^-$-type drift layer 1 indicates a portion on the upper surface side relative to a region where the crystal defect V is formed among the $n^-$-type drift layer 1. Under this condition, the donor concentration of the lifetime control region 50 is sufficiently low, so that it is possible to sufficiently perform lifetime control. In other words, in the present embodiment, by preventing protons from turning into donors to leave the crystal defect V, the function of the lifetime control region 50 can be sufficiently exerted.

Further, the donor concentration of the n-type buffer layer 3 is preferably equal to or greater than 50 times of the maximum value of the donor concentration of the lifetime control region 50. In this event, the donor concentration of the n-type buffer layer 3 is sufficiently high, so that it is possible to sufficiently prevent the depletion layer from extending. In other words, the n-type buffer layer 3 can be made to function as a field stop layer. In this event, the lifetime control region 50 in the $n^-$-type drift layer 1 does not perform a function as the field stop layer. The concentration of each layer can be freely changed in the above-described concentration range.

A method for forming the lifetime control region 50 and the n-type buffer layer 3 will be described next. As the method for manufacturing the semiconductor device 100 or the semiconductor device 101, as described above, the process of forming the upper surface side of the semiconductor substrate is performed first. Here, the p-type base layer 15 provided on the upper surface side of the IGBT region 10 among the n-type semiconductor substrate, the $n^+$-type source layer 13 provided on the upper surface side of the p-type base layer 15, and the p-type anode layer 25 provided on the upper surface side of the diode region 20 among the semiconductor substrate are formed. These layers are formed by implanting a donor impurity or an acceptor impurity from the upper surface side of the semiconductor substrate and performing heating.

Then, a process of forming the back surface side of the semiconductor substrate is performed. First, protons are injected from the back surface side of the diode region 20 at first acceleration energy. Then, protons are injected from the back surface side of the diode region 20 at second acceleration energy smaller than the first acceleration energy. Then, the region to which protons are injected at the first acceleration energy is heated at a temperature lower than 350° C. to form the lifetime control region 50. This heating will be referred to as first heating. Then, the region to which protons are injected at the second acceleration energy is heated at a temperature equal to or higher than 350° C. to form the n-type buffer layer 3. This heating will be referred to as second heating. The n-type buffer layer 3 is formed between the $n^+$-type cathode layer 26 and the lifetime control region 50 in the thickness direction of the semiconductor substrate.

An electric furnace is preferably used in the first heating. The lifetime control region 50 is heated at a temperature lower than 350° C. in the electric furnace. Protons are activated by being heated at a temperature from 350° C. to 500° C. Heating at a low temperature at which protons are not activated can prevent change in electric characteristics due to self-heating during energization.

Laser annealing is preferably used in the second heating. The injected protons are activated so as not to prevent the depletion layer from extending in the n-type buffer layer 3. In this event, only a surface layer of the back surface of the semiconductor substrate is locally heated so as to prevent heat from conducting to protons injected to the lifetime control region 50. With laser annealing, it is possible to achieve local heating. An irradiation period and a temperature of laser annealing are adjusted in accordance with the depth to which protons are injected to the n-type buffer layer 3. This can activate protons in the n-type buffer layer 3 while preventing protons in the lifetime control region 50 from being activated.

The order of the first heating and the second heating may be freely changed. Further, the order of injection of protons to the lifetime control region 50 and the n-type buffer layer 3 may be freely changed. Still further, it is not necessary to continuously inject protons to the lifetime control region 50 and the n-type buffer layer 3. The second heating may be performed after protons are injected to the n-type buffer layer 3, and then, protons injection to the lifetime control region 50 and the first heating may be performed. Further, the process of the first heating may be deleted as necessary.

In the process of injecting protons, protons may also be injected to the IGBT region 10. By this means, the lifetime control region 50 and the n-type buffer layer 3 can also be formed in the IGBT region 10. Further, only the n-type buffer layer 3 may be formed without the lifetime control region 50 being formed in the IGBT region 10.

Then, the p-type collector layer 16 provided on the back surface side of the IGBT region 10, and the $n^+$-type cathode layer 26 provided on the back surface side of the n-type buffer layer 3 among the diode region 20 are formed. The p-type collector layer 16 is formed by implanting an acceptor impurity and performing heating. The $n^+$-type cathode layer 26 is formed by implanting a donor impurity and performing heating. The order of injection and heating of the p-type collector layer 16, the $n^+$-type cathode layer 26, the n-type buffer layer 3, and the lifetime control region 50 can be freely changed.

The n-type buffer layer 3 is preferably formed by injecting protons in a similar manner to the lifetime control region 50 for manufacturing reasons. However, as described above, the n-type buffer layer 3 may be formed on the back surface side of the lifetime control region 50 by implanting a donor at a portion shallower than a portion in the lifetime control region 50 from the back surface side of the diode region 20 and heating the region to which the donor is injected. The donor impurity for forming the n-type buffer layer 3 is, for example, phosphorus.

As a first modification of the present embodiment, a distance between a peak position of crystal defect density of the lifetime control region 50 and the center M1 in the thickness direction of the semiconductor substrate may be less than a distance between the peak position of the crystal defect density and the back surface of the semiconductor substrate in the thickness direction of the semiconductor substrate. By designing the peak position of the crystal defect density of the lifetime control region 50 closer to the center M1 in the thickness direction of the semiconductor substrate, the crystal defect V can be formed over a wide range. It is therefore possible to further reduce recovery losses Err.

The peak position of the crystal defect density can be adjusted by changing a position where protons are injected. The position where protons are injected can be adjusted by changing an acceleration voltage upon injection of protons. For example, protons can be injected to a position deeper from the back surface as the acceleration voltage is made higher.

Figure 26:
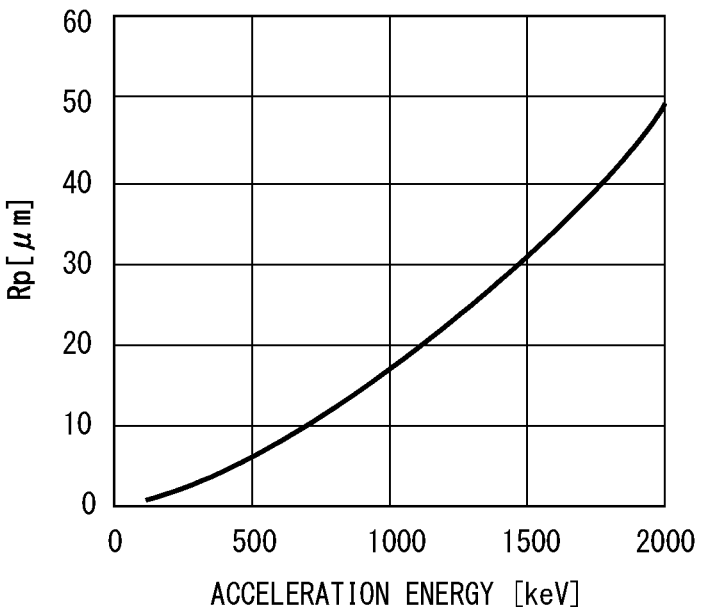
FIG. 26 is a view for explaining a range of protons in silicon.

As a second modification of the present embodiment, a thickness of the semiconductor substrate may be equal to or less than 180 μm. FIG. 26 is a view for explaining a range of protons in silicon. FIG. 26 indicates a calculation value of the range of protons in silicon with respect to acceleration energy of protons. In a case where protons are injected at acceleration energy of 2000 KeV in silicon using a typical injection device, a distance from the back surface of the semiconductor substrate to the peak position of protons becomes approximately 45 μm at a maximum. In this event, if the thickness of the semiconductor substrate is made equal to or less than 180 μm, an effective lifetime control region 50 can be formed. The thickness of the semiconductor substrate can be adjusted by changing a cut amount of the back surface.

As a third modification of the present embodiment, the semiconductor substrate may be made with a wideband gap semiconductor. The wideband gap semiconductor is, for example, silicon carbide, a gallium nitride material or diamond. According to the present embodiment, even in a case where the semiconductor substrate is made with a wideband gap semiconductor and operates at a high temperature, tail currents during recovery operation can be effectively reduced.

These modifications can be appropriately applied to semiconductor devices and methods for manufacturing the semiconductor devices according to embodiments below. Meanwhile, for the semiconductor devices and the methods for manufacturing the semiconductor devices according to the embodiments below, dissimilarities with the first embodiment will mainly be explained as they have many similarities with the first embodiment.

Second Embodiment

Figure 27:
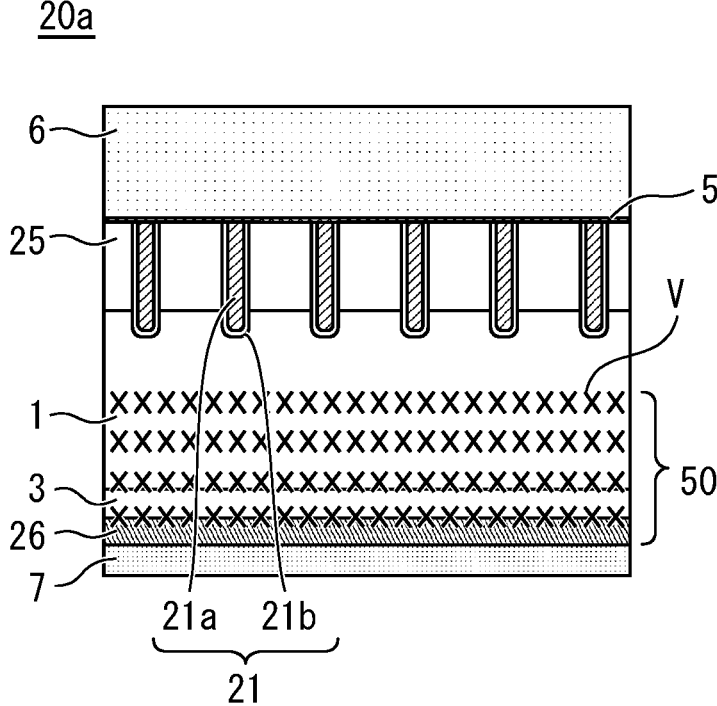
FIG. 27 is a cross-sectional diagram of a diode region according to the second embodiment.
Figure 28:
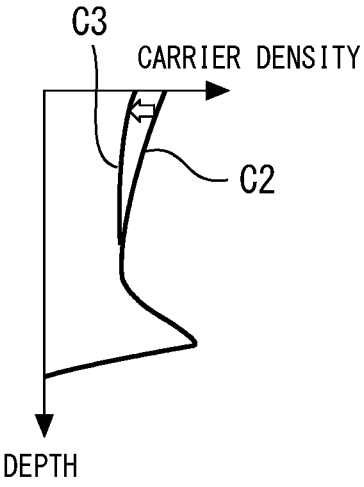
FIG. 28 is a view for explaining carrier density according to the second embodiment.

FIG. 27 is a cross-sectional diagram of a diode region according to the second embodiment. In the present embodiment, the p-type anode layer 25 has lower acceptor concentration than that of the p-type base layer 15. Other configurations are the same as the configurations in the first embodiment. FIG. 28 is a view for explaining carrier density according to the second embodiment. FIG. 28 indicates carrier density with respect to a position in a depth direction of the diode region 20a. Carrier density C3 in a case where the p-type anode layer 25 has lower concentration becomes lower on the upper surface side than carrier density C2 in a case where the p-type anode layer 25 has higher concentration.

In the present embodiment, the number of holes to be injected to the diode region 20a during diode operation can be reduced. Thus, carrier density on the upper surface side of the diode region 20a is reduced compared to that in the first embodiment. It is therefore possible to further reduce the recovery losses Err. Note that as illustrated in FIG. 27, the n-type carrier accumulation layer 2 does not have to be provided.

By making concentration of an acceptor to be implanted to the p-type base layer 15 lower than concentration of an acceptor to be implanted to the p-type anode layer 25, the acceptor concentration of the p-type anode layer 25 can be made lower than that of the p-type base layer 15 after activation. Both the p-type base layer 15 and the p-type anode layer 25 are far from the upper surface of the semiconductor substrate. It is therefore preferable to perform activation through heating at an electric furnace.

Third Embodiment

Figure 29:
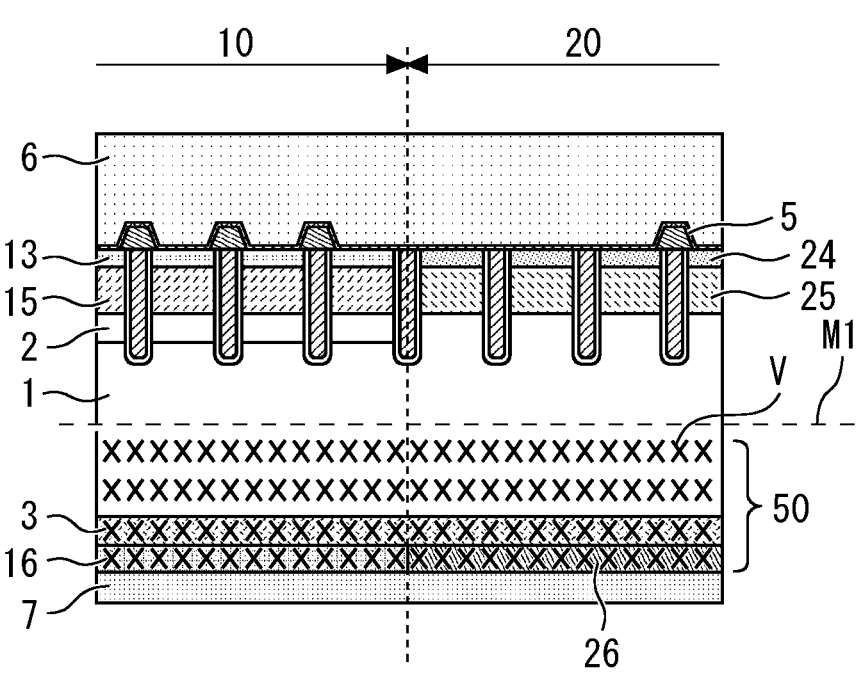
FIG. 29 is a cross-sectional diagram illustrating a configuration of a boundary of the IGBT region and the diode region according to the third embodiment.

FIG. 29 is a cross-sectional diagram illustrating a configuration of a boundary of the IGBT region 10 and the diode region 20 according to the third embodiment. In the present embodiment, the lifetime control region 50 is provided on the back surface side relative to the center M1 in the thickness direction of the semiconductor substrate among the IGBT region 10. Also in the IGBT region 10, the lifetime control region 50 has higher crystal defect density than a portion other than the lifetime control region 50 of the n$^-$-type drift layer 1 and includes protons. Other configurations are similar to the configurations of the first embodiment. Note that as illustrated in FIG. 29, the n-type carrier accumulation layer 2 is provided in the IGBT region 10 and does not have to be provided in the diode region 20.

In the present embodiment, it is possible to reduce remaining carriers to be discharged when the depletion layer in the IGBT region 10 extends upon turn-off of the semiconductor device. It is therefore possible to also reduce turn-off losses Eoff.

Meanwhile, technical features explained in each embodiment may be appropriately combined to use.

According to a semiconductor device and a method for manufacturing the semiconductor device according to the present disclosure, it is possible to reduce tail currents during recovery operation by a lifetime control region.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2021-172675, filed on Oct. 21, 2021 including specification, claims, drawings and summary, on which the Convention priority of the present application is based, are incorporated herein by reference in its entirety.

The invention claimed is:
1. A semiconductor device comprising:
a semiconductor substrate including an IGBT region and a diode region;
a first electrode provided on an upper surface of the semiconductor substrate; and a second electrode provided on a back surface that is an opposite side of the upper surface of the semiconductor substrate, wherein the diode region includes an n-type drift layer, a p-type anode layer provided on an upper surface side of the drift layer, and an n-type cathode layer provided on a back surface side of the drift layer, a first lifetime control region within the drift layer, the first lifetime control region having crystal defect density higher than crystal defect density of other portions of the drift layer and including protons is provided on a back surface side relative to a center in a thickness direction of the semiconductor substrate, and a maximum value of donor concentration of the first lifetime control region is equal to or less than $1.0 \times 10^{15}/cm^3$.

2. A semiconductor device comprising:

a semiconductor substrate including an IGBT region and a diode region;

a first electrode provided on an upper surface of the semiconductor substrate; and a second electrode provided on a back surface that is an opposite side of the upper surface of the semiconductor substrate, wherein the diode region includes an n-type drift layer, a p-type anode layer provided on an upper surface side of the drift layer, and an n-type cathode layer provided on a back surface side of the drift layer, a first lifetime control region within the drift layer, the first lifetime control region having crystal defect density higher than crystal defect density of other portions of the drift layer and including protons is provided on a back surface side relative to a center in a thickness direction of the semiconductor substrate, and a maximum value of donor concentration of the first lifetime control region is equal to or less than 10 times of donor concentration of the other portions of the drift layer.

3. The semiconductor device according to claim 1, wherein an n-type buffer layer is provided at a position deeper than a position where the cathode layer is provided on a back surface side of the drift layer, and donor concentration of the buffer layer is equal to or greater than 50 times of the maximum value of the donor concentration of the first lifetime control region.

4. The semiconductor device according to claim 1, wherein a distance between a peak position of the crystal defect density of the first lifetime control region and a center in the thickness direction of the semiconductor substrate is smaller than a distance between the peak position and the back surface of the semiconductor substrate in the thickness direction of the semiconductor substrate.

5. The semiconductor device according to claim 1, wherein a thickness of the semiconductor substrate is equal to or less than 180 μm.

6. The semiconductor device according to claim 1, wherein the IGBT region includes a p-type base layer on the upper surface side of the semiconductor substrate, and the anode layer has acceptor concentration lower than acceptor concentration of the base layer.

7. The semiconductor device according to claim 1, wherein a second lifetime control region within the IGBT region, the second lifetime control region having crystal defect density higher than crystal defect density of the other portions of the drift layer and including protons is provided on a back surface side relative to a center in the thickness direction of the semiconductor substrate.

8. The semiconductor device according to claim 1, wherein the semiconductor substrate is made with a wide band gap semiconductor.

9. The semiconductor device according to claim 8, wherein the wide band gap semiconductor is silicon carbide, gallium-nitride-based material or diamond.

10. The semiconductor device according to claim 2, wherein an n-type buffer layer is provided at a position deeper than a position where the cathode layer is provided on a back surface side of the drift layer, and donor concentration of the buffer layer is equal to or greater than 50 times of the maximum value of the donor concentration of the first lifetime control region.

11. The semiconductor device according to claim 2, wherein a distance between a peak position of the crystal defect density of the first lifetime control region and a center in the thickness direction of the semiconductor substrate is smaller than a distance between the peak position and the back surface of the semiconductor substrate in the thickness direction of the semiconductor substrate.

12. The semiconductor device according to claim 2, wherein a thickness of the semiconductor substrate is equal to or less than 180 μm.

13. The semiconductor device according to claim 2, wherein the IGBT region includes a p-type base layer on the upper surface side of the semiconductor substrate, and the anode layer has acceptor concentration lower than acceptor concentration of the base layer.

14. The semiconductor device according to claim 2, wherein a second lifetime control region within the IGBT region, the second lifetime control region having crystal defect density higher than crystal defect density of the other portions of the drift layer and including protons is provided on a back surface side relative to a center in the thickness direction of the semiconductor substrate.

15. The semiconductor device according to claim 2, wherein the semiconductor substrate is made with a wide band gap semiconductor.

16. The semiconductor device according to claim 15, wherein the wide band gap semiconductor is silicon carbide, gallium-nitride-based material or diamond.

* * * * *